United States Patent
Abiko et al.

(10) Patent No.: US 8,034,639 B2
(45) Date of Patent: Oct. 11, 2011

(54) METHOD FOR MANUFACTURING SOLAR CELL MODULE

(75) Inventors: Yoshiya Abiko, Osaka (JP); Yasushi Funakoshi, Osaka (JP); Kyotaro Nakamura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/865,207

(22) PCT Filed: Dec. 18, 2008

(86) PCT No.: PCT/JP2008/073100
§ 371 (c)(1),
(2), (4) Date: Jul. 29, 2010

(87) PCT Pub. No.: WO2009/096114
PCT Pub. Date: Aug. 6, 2009

(65) Prior Publication Data
US 2011/0014725 A1    Jan. 20, 2011

(30) Foreign Application Priority Data

Jan. 31, 2008    (JP) .................................. 2008-021493

(51) Int. Cl.
*H01L 21/00*    (2006.01)
(52) U.S. Cl. .................. 438/4; 438/22; 438/48; 438/65; 438/E21.526
(58) Field of Classification Search ................ 438/4, 22, 438/48–52, 57, 65–67, 80; 316/244–246
See application file for complete search history.

(56) References Cited

U.S. PATENT DOCUMENTS

| | | | |
|---|---|---|---|
| 5,972,732 A | 10/1999 | Gee et al. | |
| 6,313,396 B1 * | 11/2001 | Glenn | 136/244 |

FOREIGN PATENT DOCUMENTS

| | | |
|---|---|---|
| JP | 52-24481 | 2/1977 |
| JP | 53-94194 | 8/1978 |
| JP | 61-67966 | 4/1986 |
| JP | 4-15962 | 1/1992 |
| JP | 8-298334 | 11/1996 |
| JP | 11-204816 | 7/1999 |
| JP | 2002-231983 | 8/2002 |
| JP | 2005-235920 | 9/2005 |
| JP | 2005-340362 | 12/2005 |
| WO | 2007/125778 | 11/2007 |

OTHER PUBLICATIONS

International Search Report for PCT/JP2008/073100 mailed, Jan. 27, 2009.

* cited by examiner

*Primary Examiner* — Dung A. Le
(74) *Attorney, Agent, or Firm* — Nixon & Vanderhye P.C.

(57) ABSTRACT

Disclosed is a method for manufacturing a solar cell module in which a wiring substrate having a base material and a wiring formed on the base material, and a plurality of solar cells electrically connected by being placed on the wiring of the wiring substrates are sealed with a sealant, including a first step of placing at least one of the solar cells on the wiring of the wiring substrate, and a second step of sealing the wiring substrate and the solar cells with the sealant, the method including the step of conducting an inspection of the solar cells after the first step and before the second step.

11 Claims, 15 Drawing Sheets

(a)

(b)

(a)

106 107

(b)

106 107

(a)

(b)

(a)

(b)

(a)

(b)

(c)

though such a problem is not described in Patent Document 1, dimensional inspection (shape inspection), appearance inspection, and the like are generally conducted after fabrication of solar cell modules to prevent shipment of defective solar cell modules. Therefore, the solar cell modules to be discarded as defectives described above have been a cause of a significantly low manufacturing yield of the solar cell modules.

METHOD FOR MANUFACTURING SOLAR CELL MODULE

This application is the U.S. national phase of International Application No. PCT/JP2008/073100, filed 18 Dec. 2008, which designated the U.S. and claims priority to Japanese Application No. 2008-021493, filed 31 Jan. 2008, the entire contents of each of which are hereby incorporated by reference.

TECHNICAL FIELD

The present invention relates to a method for manufacturing a solar cell module, and in particular to a method for manufacturing a solar cell module configured by electrically connecting a plurality of solar cells by placing them on a wiring substrate, and sealing them with a sealant, that can improve a manufacturing yield of the solar cell module.

BACKGROUND ART

In recent years, it has been desired to develop clean energy because of global environmental problems and the like such as exhaustion of energy resources and an increase in $CO_2$ in the atmosphere. In particular, photovoltaic power generation using solar cell modules has been developed, put to practical use and is progressing as a new energy source.

As a solar cell that configures such a solar cell module, a double surface electrode type solar cell has been conventionally a mainstream, in which a p-n junction is formed for example by diffusing impurities whose conductivity type is opposite to that of a monocrystalline or polycrystalline silicon substrate, over a light receiving surface of the silicon substrate, and electrodes are formed on the light receiving surface of the silicon substrate and a back surface opposite to the light receiving surface, respectively. In addition, development of a so-called back surface electrode type solar cell has been advanced in recent years, in which an electrode for the p type and an electrode for the n type are both formed on a back surface of a silicon substrate.

In addition, the thickness of the silicon substrate has also been reduced in order to reduce the cost of raw materials. There arises a problem, however, that reduction in the thickness of the solar cell due to reduction in the thickness of the silicon substrate results in a crack in the solar cell during the operation of wiring the solar cells when the solar cell module is fabricated.

In order to solve such a problem, for example, Japanese Patent Laying-Open No. 2005-340362 (Patent Document 1) describes a solar cell module electrically connecting solar cells by placing the solar cells on a wiring of a wiring substrate.

Patent Document 1: Japanese Patent Laying-Open No. 2005-340362

DISCLOSURE OF THE INVENTION

Problems to be Solved by the Invention

FIG. 18 shows a flowchart of a manufacturing process for manufacturing the solar cell module described in Patent Document 1. As shown in FIG. 18, when the solar cell module described in Patent Document 1 is manufactured, firstly, in step 1a(S1a), a solar cell is transported onto a predetermined stage to conduct a dimensional inspection (shape inspection) and an appearance inspection of the solar cell.

Next, in step 2a (S2a), positioning of the solar cell is performed to determine at what position on a wiring pattern of a wiring substrate and in what direction the solar cell is to be placed.

Subsequently, in step 3a (S3a), solar cells are sequentially transported and arranged at predetermined positions on the wiring pattern of the wiring substrate in accordance with the positioning performed in step 2a (S2a), and wirings of the wiring substrate and electrodes of the solar cells placed thereon are sequentially fixed, using solder or the like. Thereby, the wirings of the wiring substrate are electrically connected with the solar cells placed thereon, and the solar cells are also electrically connected with each other.

Next, in step 4a (S4a), the wiring substrate and a plurality of solar cells fixed to the wiring substrate are sealed with a sealant. Thereafter, a terminal box is attached to a back surface of the sealant and an aluminum frame is fitted to the outer periphery of the sealant, and thus a solar cell module is fabricated.

Subsequently, in step 5a (S5a), a predetermined inspection is conducted on the solar cell module fabricated as described above. Then, a solar cell module not satisfying predetermined criteria is discarded as a defective, and only solar cell modules satisfying predetermined criteria are shipped as completed products.

In the method for manufacturing a solar cell module described above, however, if a solar cell module includes a single solar cell which has low characteristics, which includes a portion that is defective in appearance, or in which a problem in terms of product reliability is highly likely to occur, the entire solar cell module is considered as a defective due to the single solar cell having low characteristics, and should be discarded. Therefore, there has been a problem that the solar cell module has a significantly low manufacturing yield.

In view of the above circumstances, one object of the present invention is to provide a solar cell module configured by electrically connecting a plurality of solar cells by placing them on a wiring substrate, and sealing them with a sealant, that can improve a manufacturing yield of the solar cell module.

Means for Solving the Problems

The present invention is a method for manufacturing a solar cell module in which a wiring substrate having a base material and a wiring formed on the base material, and a plurality of solar cells electrically connected by being placed on the wiring of the wiring substrate are sealed with a sealant, including a first step of placing at least one of the solar cells on the wiring of the wiring substrate, and a second step of sealing the wiring substrate and the solar cells with the sealant, the method including the step of conducting an inspection of the solar cells after the first step and before the second step.

Preferably, in the method for manufacturing a solar cell module according to the present invention, the inspection of the solar cells is conducted on each of the solar cells placed on the wiring of the wiring substrate.

Preferably, the method for manufacturing a solar cell module according to the present invention includes the step of removing the solar cell determined by the inspection of the solar cells as not satisfying predetermined criteria, from on the wiring of the wiring substrate.

Preferably, the method for manufacturing a solar cell module according to the present invention includes the step of fixing the solar cell determined by the inspection of the solar cells as satisfying predetermined criteria, to the wiring substrate using a fixing member.

Preferably, in the method for manufacturing a solar cell module according to the present invention, the fixing member is at least one type selected from the group consisting of an adhesive tape, a viscous adhesive tape, an adhesive, and a viscous adhesive agent.

Preferably, in the method for manufacturing a solar cell module according to the present invention, the fixing member is made of at least one of a transparent resin and an ultraviolet curing resin.

Preferably, in the method for manufacturing a solar cell module according to the present invention, the fixing member couples a light receiving surface of the solar cell and a surface of the wiring substrate on a side where the solar cell is placed.

Preferably, in the method for manufacturing a solar cell module according to the present invention, the wiring substrate and the solar cells are sealed with the sealant with an electrode of the solar cell being in direct contact with the wiring of the wiring substrate.

Further, in the method for manufacturing a solar cell module according to the present invention, a through hole penetrating from one surface to the other surface of the base material may be formed in the wiring substrate.

Further, in the method for manufacturing a solar cell module according to the present invention, the base material for the wiring substrate may be made of a transparent resin.

Preferably, in the method for manufacturing a solar cell module according to the present invention, the sealant includes at least one type of transparent resin selected from the group consisting of an ethylene vinyl acetate resin, an epoxy resin, an acrylic resin, a urethane resin, an olefin-based resin, a polyester resin, a silicone resin, a polystyrene resin, a polycarbonate resin, and a rubber-based resin.

Preferably, in the method for manufacturing a solar cell module according to the present invention, the solar cell is a back surface electrode type solar cell.

EFFECTS OF THE INVENTION

According to the present invention, a method for manufacturing a solar cell module configured by electrically connecting a plurality of solar cells by placing them on a wiring substrate, and sealing them with a sealant, that can improve a manufacturing yield of the solar cell module can be provided.

DESCRIPTION OF THE REFERENCE SIGNS

Figure 1:
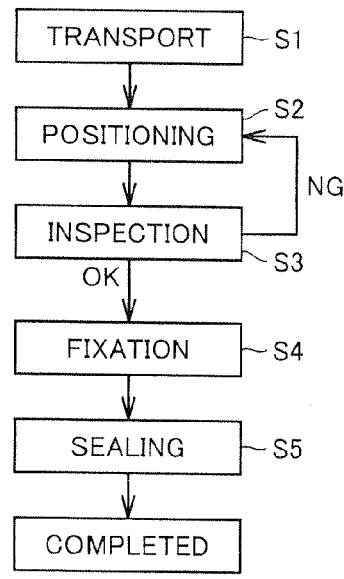
FIG. 1 is a flowchart of an exemplary method for manufacturing a solar cell module of the present invention.

100: solar cell, 101: silicon substrate, 102: antireflection film, 103: passivation film, 104: n-type impurity-doped region, 105: p-type impurity-doped region, 106: n electrode, 107: p electrode, 109: wiring for the n type, 110: wiring for the p type, 111: insulating base material, 113: connecting electrode, 114: bus bar p electrode, 115: bus bar n electrode, 116: conductive member, 124: transparent substrate, 125: sealant, 125a: first transparent resin, 125b: second transparent resin, 126: insulating film, 127: metal film, 128: protective sheet, 130, 131: through hole, 200: wiring substrate, 300: transport unit, 300a: support portion, 300b: main body portion, 301: camera, 302: probe, 303: light source, 304: thermo viewer camera, 305: CCD camera for appearance inspection, 306: cooled CCD camera for EL inspection, 307: suction mechanism, 308: positioning camera, 309: adhesive supply portion, 310: ultraviolet LED, 500: fixing tape.

BEST MODES FOR CARRYING OUT THE INVENTION

Embodiments of the present invention will be described hereinafter. In the drawings of the present invention, the same reference characters denote the same or corresponding portions.

FIG. 1 shows a flowchart of an exemplary method for manufacturing a solar cell module of the present invention.

Firstly, in step 1 (S1), for example, by a transport unit for holding and transporting a solar cell, a solar cell is held and transported to a predetermined stage, and the solar cell is placed on the stage. A dimensional inspection (shape inspection) and an appearance inspection of the solar cell are conducted on the stage.

Here, the dimensional inspection (shape inspection) of the solar cell can be conducted, for example, by disposing the solar cell on a front surface of a stage having transparency or permeability for red light, applying red light from a back surface of the stage, capturing a shape of the solar cell with a camera or the like above the solar cell, and measuring dimensions (a longitudinal length, a lateral width, a diameter, and the like) of each solar cell from the shape.

Further, the appearance inspection of the solar cell can be conducted in a manner similar to the above, for example, by disposing the solar cell on a front surface of a stage having transparency or permeability for red light, applying red light from a back surface of the stage, thereby inspecting the solar cell for a chip or a crack using a CCD (Charge-Coupled Devices) camera or the like above the solar cell, and also inspecting the solar cell for color unevenness in an antireflection film, adhesion of a foreign substance, and the like. It is to be noted that the inspection of the solar cell for color unevenness in an antireflection film, adhesion of a foreign substance, and the like is conducted using a CCD camera that reacts to a desired color.

Preferably, a solar cell determined as not satisfying predetermined criteria in the dimensional inspection (shape inspection) and the appearance inspection described above is removed at this stage so as not to proceed to a subsequent step.

Figure 2:
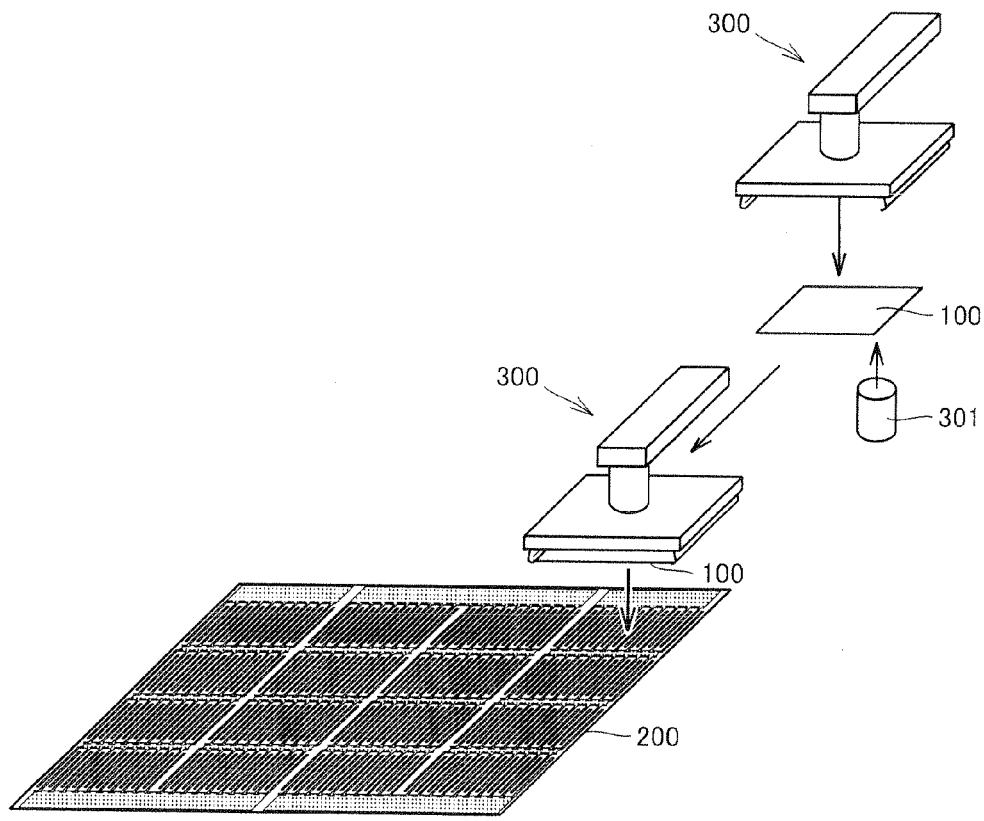
FIG. 2 is a schematic perspective view illustrating a portion of steps of the method for manufacturing a solar cell module of the present invention.

Next, in step 2 (S2) of FIG. 1, positioning of the solar cell is performed. Here, to position the solar cell, as shown for example in FIG. 2, a pattern of a solar cell 100, such as an alignment mark formed on a front surface or a back surface of solar cell 100 and/or an edge of solar cell 100, is recognized using a camera 301 to determine at what position on a wiring pattern of a wiring substrate 200 and in what direction solar cell 100 is to be placed. Then, solar cell 100 is held by a transport unit 300 and the orientation of solar cell 100 is changed in accordance with the determination. On this occasion, transport unit 300 preferably has a mechanism that can change the orientation of solar cell 100 in XYθ directions (i.e., an X axis direction, a Y axis direction, and a direction inclined by an angle θ from the X axis or the Y axis).

Subsequently, in step 3 (S3) of FIG. 1, an inspection of the solar cell is conducted. Here, as shown for example in FIG. 2, the inspection of the solar cell can be conducted with solar cell 100, after being transported by transport unit 300 to a desired position on the wiring pattern of wiring substrate 200 in accordance with the positioning of solar cell 100 described above and placed on the wiring pattern of wiring substrate 200 (a first step), being pressed to the wiring pattern of wiring substrate 200 by transport unit 300. As a pressing method, it is preferable to use, for example, a pressing method applying physical pressure from above a solar cell, and/or a pressing method using a vacuum suction mechanism. If the pressing method applying physical pressure from above a solar cell is employed, a buffer material is preferably placed between a pressurizing member for applying physical pressure and the solar cell to reduce damage to the solar cell.

Figure 3:
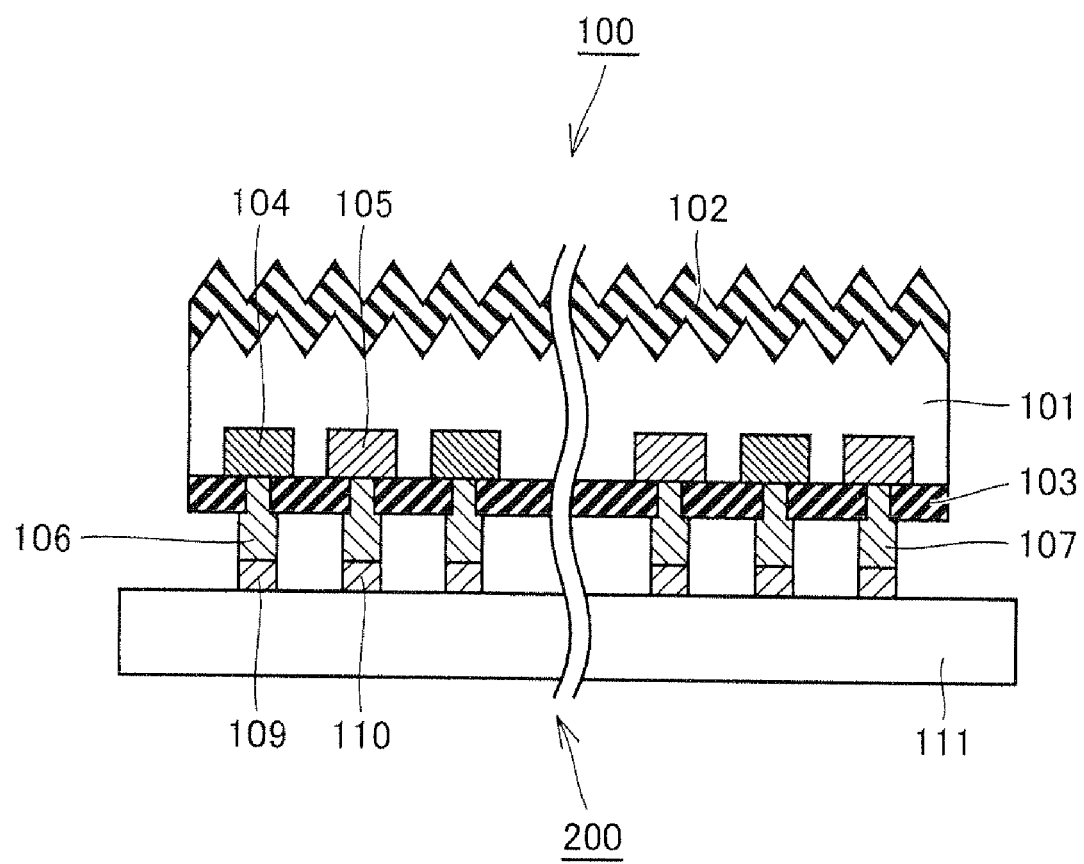
FIG. 3 is a schematic cross sectional view of an exemplary state where a solar cell is placed on a wiring pattern of a wiring substrate in the present invention.

FIG. 3 shows a schematic cross sectional view of an exemplary state where solar cell 100 is placed on the wiring pattern of wiring substrate 200. Here, solar cell 100 is placed on the wiring pattern of wiring substrate 200 such that an n electrode 106 of solar cell 100 comes into contact with a wiring for the n type 109 equivalent to a portion of the wiring pattern of wiring substrate 200, and a p electrode 107 of solar cell 100 comes into contact with a wiring for the p type 110 equivalent to another portion of the wiring pattern of wiring substrate 200.

Here, it is preferable that solar cell 100 is placed on the wiring pattern of wiring substrate 200 such that n electrode 106 of solar cell 100 comes into direct contact with wiring for the n type 109 of wiring substrate 200 and p electrode 107 of solar cell 100 comes into direct contact with wiring for the p type 110 of wiring substrate 200. By bringing the electrodes of solar cell 100 into direct contact with the wiring pattern of wiring substrate 200 to establish electrical connection without fixing these members using solder or the like, it becomes easier to remove solar cell 100 not satisfying predetermined criteria in the inspection described later for example, from the wiring pattern of wiring substrate 200, and placing another solar cell 100 instead. Therefore, the direct contact is preferable in that it is effective to easily improve reliability and characteristics of the solar cell module.

In this example, an antireflection film 102 is formed on a light receiving surface (a surface on the side on which sunlight is mainly incident) of a silicon substrate 101 of solar cell 100. An n-type impurity-doped region 104 formed by diffusing n-type impurities and a p-type impurity-doped region 105 formed by diffusing p-type impurities are alternately formed at a predetermined spacing on a back surface (a surface opposite to the light receiving surface) of silicon substrate 101.

Further, in this example, a passivation film 103 is formed on the back surface of silicon substrate 101. Through contact holes formed in passivation film 103, n electrode 106 is formed to come into contact with n-type impurity-doped region 104, and p electrode 107 is formed to come into contact with p-type impurity-doped region 105.

Furthermore, in this example, wiring substrate 200 has an insulating substrate 111 serving as a base material, and wiring for the n type 109 and wiring for the p type 110 equivalent to wirings that configure the wiring pattern formed on insulating substrate 111.

Regarding the inspection of solar cell 100, it is preferable to conduct at least a portion of inspections classified for example into six items described below as (1) to (6).

(1) Forward IV (Current-Voltage) Characteristic

An inspection of a forward IV (current-voltage) characteristic of solar cell 100 can be conducted by inspecting a forward IV (current-voltage) characteristic of solar cell 100 in each of a dark state (a state where no light is applied to solar cell 100) and a light state (a state where light is applied to solar cell 100).

Firstly, the forward IV (current-voltage) characteristic of solar cell 100 in the dark state can be inspected, for example, by bringing probes into contact with wiring for the n type 109 of wiring substrate 200 electrically connected to n electrode 106 of solar cell 100 and wiring for the p type 110 of wiring substrate 200 electrically connected to p electrode 107 of solar cell 100, respectively, measuring a current value obtained when a forward voltage varying in the range of, for example, about −3 V to +1 V is applied between these probes, and evaluating the current value.

Further, the forward IV (current-voltage) characteristic of solar cell 100 in the light state can be inspected by a method similar to that for the dark state, in a state for example where light having a wavelength in an optical sensitivity region of solar cell 100 is applied all over the light receiving surface of solar cell 100 using a xenon lamp, a halogen lamp, a white light emitting diode, or the like, as a light source.

(2) Reverse IV (Current-Voltage) Characteristic

A reverse IV (current-voltage) characteristic of solar cell 100 can be inspected, for example, by bringing probes into contact with wiring for the n type 109 of wiring substrate 200 electrically connected to n electrode 106 of solar cell 100 and wiring for the p type 110 of wiring substrate 200 electrically connected to p electrode 107 of solar cell 100, respectively, applying a reverse voltage in the range of, for example, about +1 V to −20 V between these probes, and measuring and evaluating a current value obtained on that occasion. In order to evaluate a leak current on this occasion, it is preferable to measure a current value at a specified voltage (for example, −1 V) beforehand and record the current value.

(3) Heat Generation (Thermo) Characteristic

A heat generation (thermo) characteristic of solar cell 100 can be inspected, for example, by detecting a heat generating spot in solar cell 100 using a thermo viewer camera and evaluating the heat generating spot, when the reverse voltage is applied during the inspection of the reverse IV (current-voltage) characteristic described above in (2). Here, the maximum voltage of the reverse voltage applied is preferably an open voltage of the solar cell module (or an operating voltage of the solar cell module), and the maximum current is preferably a short circuit current of the solar cell module (or an operating current of the solar cell module). Preferably, this inspection is conducted at the same time with the inspection described above in (2).

(4) Interelectrode Conduction Characteristic

An interelectrode conduction characteristic of solar cell 100 can be inspected, for example, by bringing probes into contact with wiring for the n type 109 of wiring substrate 200 electrically connected to n electrode 106 of solar cell 100 and wiring for the p type 110 of wiring substrate 200 electrically connected to p electrode 107 of solar cell 100, respectively, applying a predetermined voltage between the probes to measure a resistance value, and confirming whether or not there is a short circuit.

(5) EL (Electro Luminescence) Characteristic

An EL characteristic of solar cell 100 can be inspected, for example, by bringing probes into contact with wiring for the n type 109 of wiring substrate 200 electrically connected to n electrode 106 of solar cell 100 and wiring for the p type 110 of wiring substrate 200 electrically connected to p electrode 107 of solar cell 100, respectively, applying a voltage between these probes such that a current equivalent to a short circuit current of solar cell 100 flows through solar cell 100, and imaging weak band-edge luminescence generated on that occasion using a cooled CCD camera. Based on the degree of luminescence, a microcrack in the solar cell that cannot be visually confirmed can be found, and information on in-plane distribution of characteristics and contact of the electrodes of solar cell 100 can be obtained.

(6) PL (Photo Luminescence) Characteristic

Regarding a PL characteristic of solar cell 100, for example, information on a crystal defect and the like in a semiconductor substrate that configures solar cell 100 can be obtained, for example, by applying light having a wavelength corresponding to a band edge of the semiconductor substrate that configures solar cell 100 (in this example, the semiconductor substrate is silicon substrate 101, its band edge is about 1.1 eV, and the applied light has a wavelength of about 1145 nm), and inspecting a behavior of a luminescence peak thereof.

Figure 4:
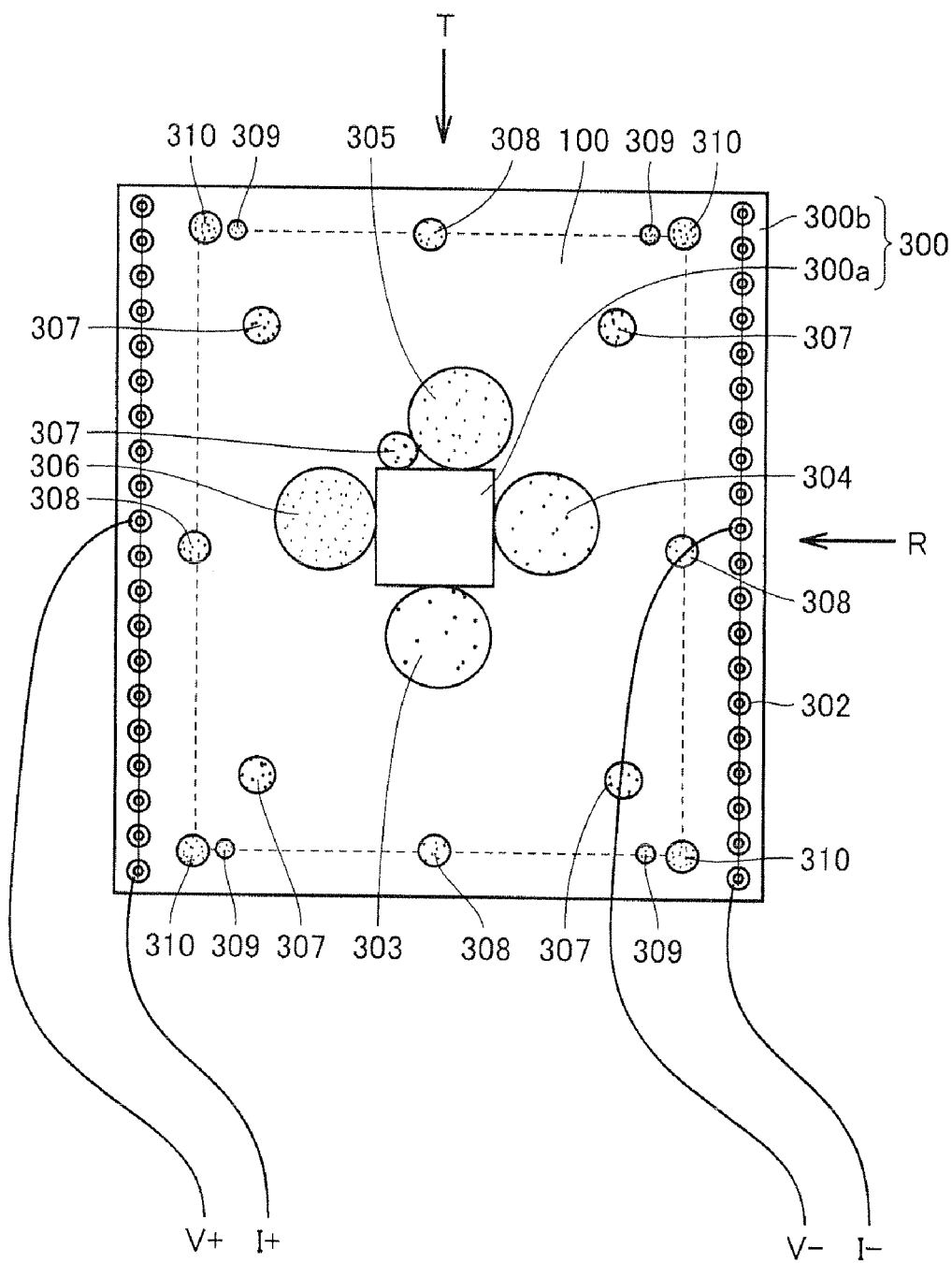
FIG. 4 is a schematic plan view, seen from above, of an exemplary transport unit that can be used in the present invention.
Figure 5:
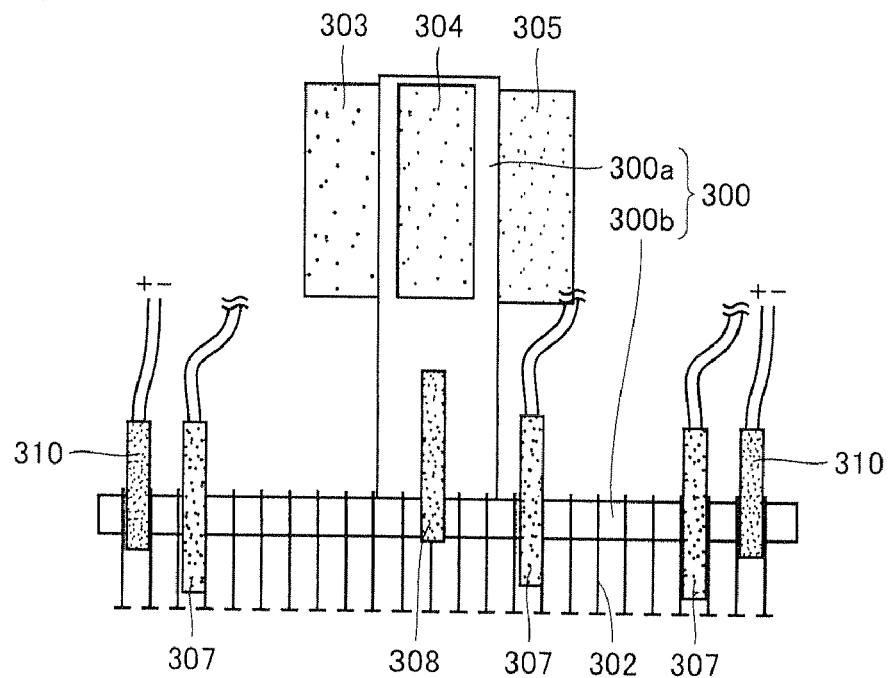
FIG. 5(a) is a schematic side view, seen from a direction indicated by an arrow R, of the transport unit shown in FIG. 4.
FIG. 5(b) is a schematic side view, seen from a direction indicated by an arrow T, of the transport unit shown in FIG. 4.
Figure 5:
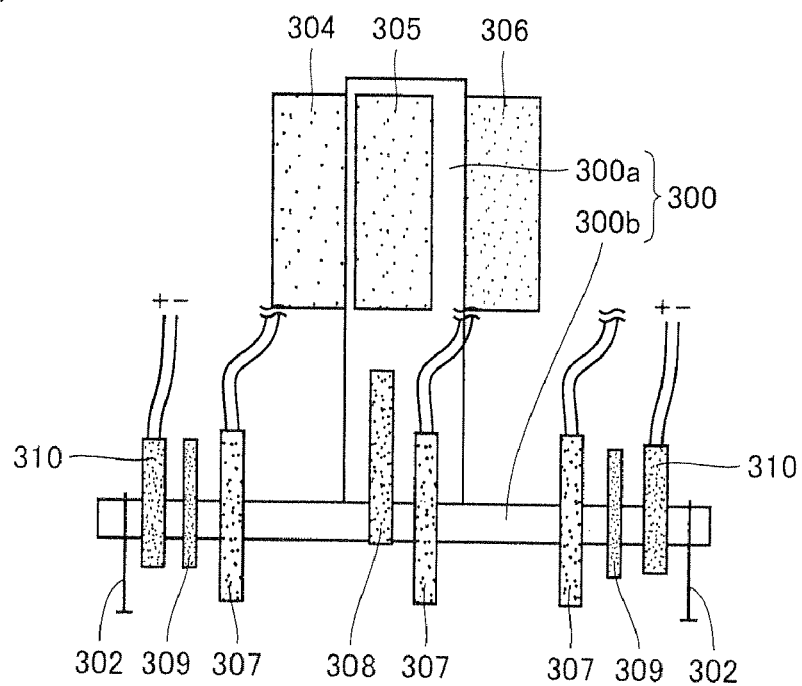

FIG. 4 shows a schematic plan view, seen from above, of an exemplary transport unit that can be used in the present invention. In addition, FIG. 5(a) shows a schematic side view, seen from a direction indicated by an arrow R, of the transport unit shown in FIG. 4, and FIG. 5(b) shows a schematic side view, seen from a direction indicated by an arrow T, of the transport unit shown in FIG. 4.

Here, transport unit 300 has a main body portion 300b in the shape of a flat plate having a quadrangular surface, and a support portion 300a bonded to a central portion of main body portion 300b for supporting main body portion 300b. Transport unit 300 is configured not only to be able to conduct at least a portion of the inspections classified into six items described above as (1) to (6), but also to be able to be utilized for the dimensional inspection (shape inspection), the appearance inspection, and the positioning of the solar cell described above. It is to be noted that, from the viewpoint of allowing various inspections to be conducted, main body portion 300b is preferably made of, for example, a transparent substance such as a transparent resin that passes at least a portion of visible light (for example, if the solar cell is a crystalline silicon solar cell, light having a wavelength in the range of longer than 300 nm and not longer than 1150 nm, which is a sensitivity wavelength thereof).

At both ends of main body portion 300b of transport unit 300, probes 302 used for being brought into contact with the wiring pattern of wiring substrate 200 in the inspections described above are linearly arranged. Conductive wires used to apply a voltage between two probes 302 may be connected to these probes 302. In addition, since probe 302 may be pressed onto the wiring pattern, it is preferable to use a pin probe with a buffer mechanism to prevent the wiring pattern from being broken by pressing probe 302.

Further, a positioning camera 308 for recognizing the edge and the like of solar cell 100 to perform the positioning of solar cell 100 described above is provided at a central portion of each side of the quadrangular surface of main body portion 300b of transport unit 300.

In addition, a suction mechanism 307 for suctioning and holding solar cell 100 is also provided in main body portion 300b of transport unit 300. Although the configuration of suction mechanism 307 is not particularly limited as long as suction mechanism 307 can suction solar cell 100, suction mechanism 307 preferably includes a mechanism capable of pressing solar cell 100 onto the wiring pattern of wiring substrate 200 in the various inspections of electrical characteristics. Further, preferably, a vacuum pipe for suctioning solar cell 100 is connected to suction mechanism 307.

In addition, at each of four corners of main body portion 300b of transport unit 300, an adhesive supply portion 309 for applying an adhesive such as an ultraviolet curing adhesive for fixing solar cell 100 described later is provided, and, adjacent thereto, an ultraviolet LED (Light Emitting Diode) 310 for applying ultraviolet light to the ultraviolet curing adhesive is provided. Preferably, an adhesive supply nozzle is connected to adhesive supply portion 309. Further, a power line can be wired to ultraviolet LED 310.

Furthermore, on four side surfaces of support portion 300a in the shape of a quadrangular prism of transport unit 300, a light source 303 used in the inspection of the forward IV (current-voltage) characteristic in the light state and the recognition of the pattern of solar cell 100, a thermo viewer camera 304 used in the inspection of the heat generation (thermo) characteristic, a CCD camera for appearance inspection 305 used in the appearance inspection of solar cell 100, and a cooled CCD camera for EL inspection 306 used in the inspection of the EL characteristic are provided, respectively.

It is to be noted that power lines can also be wired to thermo viewer camera 304, CCD camera for appearance inspection 305, cooled CCD camera for EL inspection 306, and positioning camera 308.

The inspection of solar cell 100 is conducted as described above, and preferably, the steps described below are proceeded, with solar cell 100 determined as not satisfying predetermined criteria being removed from on the wiring pattern of wiring substrate 200, and only solar cells 100 satisfying predetermined criteria being placed on the wiring pattern of wiring substrate 200. It is needless to say that the predetermined criteria described above can be set as appropriate.

Further, from the viewpoint of improving reliability and characteristics of the solar cell module, the inspection of solar cell 100 as described above is preferably conducted for each of a plurality of solar cells 100 placed on the wiring pattern of wiring substrate 200, when each solar cell 100 is placed.

Furthermore, by saving and accumulating measurement data of individual solar cells 100 obtained by the inspection described above, it also becomes possible to predict characteristics of a solar cell module configured of solar cells 100 based on inspection data of solar cells 100 arranged on wiring substrate 200, which is considered to also contribute to improvement of traceability (the ability to trace manufacturing history) after the subsequent steps or product shipment.

Then, in step 4 (S4) of FIG. 1, solar cell 100 subjected to the inspection described above is fixed to wiring substrate 200. Preferably, solar cell 100 is fixed to wiring substrate 200 using a fixing member.

Figure 6:
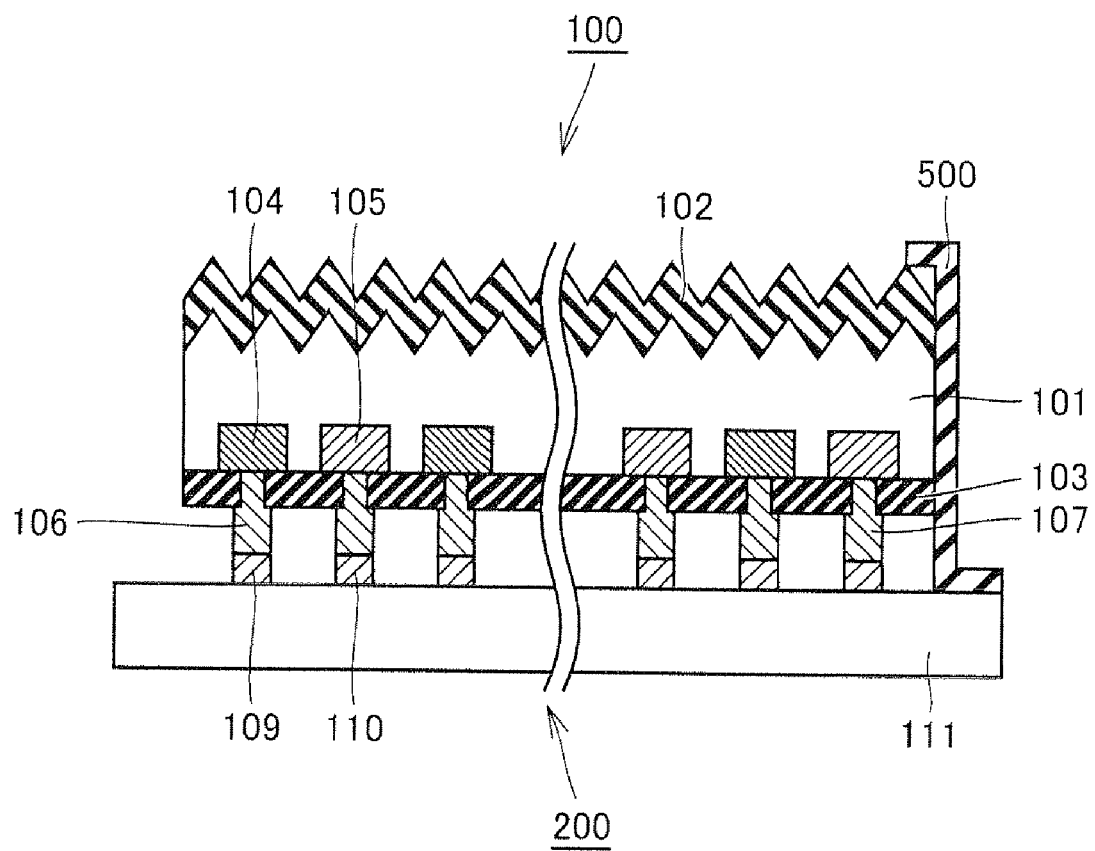
FIG. 6 is a schematic cross sectional view of an exemplary state where the solar cell is fixed on the wiring pattern of the wiring substrate using a fixing tape as a fixing member in the present invention.

FIG. 6 shows a schematic cross sectional view of an exemplary state where solar cell 100 is fixed on the wiring pattern of wiring substrate 200 using a fixing tape 500 as a fixing member. Here, as shown in FIG. 6, fixing tape 500 has one end attached to the light receiving surface of solar cell 100, and the other end attached to a surface of insulating substrate 111 of wiring substrate 200. Although a position where fixing tape 500 is attached is not particularly limited, fixing tape 500 is preferably attached to an end of the light receiving surface of solar cell 100 so as not to block the light receiving surface of solar cell 100 excessively.

As fixing tape 500, a conventionally known fixing tape can be used. For example, an adhesive tape formed by applying an adhesive to an underlying base material such as paper, a cloth or a resin film, and/or a viscous adhesive tape formed by applying a viscous adhesive agent to an underlying base material such as paper, a cloth or a resin film, and the like can be used. In particular, when at least a portion of fixing tape 500 is placed on the light receiving surface of solar cell 100, it is preferable to use, as fixing tape 500, a tape formed by applying a viscous adhesive agent or an adhesive that passes at least a portion of visible light to an underlying base material that passes at least a portion of visible light. Examples of the adhesive tape that can be used in the present invention include PET tape YT153S produced by YOUNG WOO Co., Ltd., which is formed by applying a silicone-based adhesive to an underlying base material formed of a PET (polyethylene terephthalate) film. Examples of the viscous adhesive tape include T4900, G9052 produced by Sony Chemical Corporation, which is formed by applying an acrylic-based viscous adhesive agent to an underlying base material formed of a PET film.

Further, for example, instead of or together with fixing tape 500, an adhesive and/or a viscous adhesive agent may be applied to a region from the light receiving surface of solar cell 100 to a surface of wiring substrate 200 on the side where solar cell 100 is placed.

It is to be noted that any adhesive can be used without particular limitation as long as the adhesive can affix solar cell 100 and wiring substrate 200 together, and, for example, an adhesive including at least one type selected from the group consisting of a silicone-based adhesive, an acrylic-based adhesive, an epoxy-based adhesive, and a rubber-based adhesive having a high heat resistance can be used. Here, for example, conventionally known adhesives can be used as the silicone-based adhesive, the acrylic-based adhesive, the epoxy-based adhesive, and the rubber-based adhesive, respectively. In addition, the viscous adhesive agent is a type of adhesive, and is an agent which generally has viscosity, and which has fluidity with respect to an adherend through application of pressure, and in which cohesion against peeling produces retaining power in place of curing. Examples of the adhesive that can be used in the present invention include a thermosetting adhesive such as Sealglo NE8800K produced by Fuji Chemical Industrial Co., Ltd.

Further, instead of or together with fixing tape 500, at least one of a transparent resin and an ultraviolet curing resin may be applied to the region from the light receiving surface of solar cell 100 to the surface of wiring substrate 200 on the side where solar cell 100 is placed.

Here, as the transparent resin, for example, a conventionally known transparent resin that is transparent to sunlight can be used, and in particular, it is preferable to use the same material as that of a sealant that will be described below. In this case, reactivity with the sealant is low enough that it is more likely to sufficiently suppress deterioration of electrical characteristics of the solar cell module obtained by sealing with the sealant. Examples of the transparent resin that can be used in the present invention include an EVA (ethylene vinyl acetate) resin, various types of acrylic-based curing resin, and various types of epoxy-based or olefin-based curing resin that are commercially available and has a visible light transmittance of 90% or more.

As the ultraviolet curing resin, for example, a conventionally known ultraviolet curing resin that is cured by irradiation with ultraviolet light (light having a wavelength ranging from 1 nm to 400 nm) can be used. In addition, a conventionally known additive such as a photopolymerization initiator and/or a photosensitizer may be added to the ultraviolet curing resin as required. Examples of the ultraviolet curing resin that can be used in the present invention include GL-1002 produced by Gluelabo Ltd.

It is to be noted that, when a fluid fixing member such as the adhesive, the viscous adhesive agent, the transparent resin, and the ultraviolet curing resin is used as a fixing member for fixing solar cell 100 and wiring substrate 200, the fluid fixing member can be readily placed by using a technique of dripping the fluid fixing member from the light receiving surface side of solar cell 100, and the like. Therefore, the use of the fluid fixing member is preferable.

When the ultraviolet curing resin is used as the fixing member for fixing solar cell 100 and wiring substrate 200, misalignment of solar cell 100 with respect to wiring substrate 200 can be corrected before irradiation with ultraviolet light, and after it is confirmed that there is no misalignment, ultraviolet irradiation can be provided to cure the ultraviolet curing resin to fix solar cell 100 and wiring substrate 200. Accordingly, when the ultraviolet curing resin is used as the fixing member, not only the accuracy of the position where solar cell 100 is placed on wiring substrate 200, but also handling after curing the ultraviolet curing resin and the productivity of the solar cell module can be enhanced.

The configuration has been described in the above, in which the fixing member such as fixing tape 500 (the adhesive tape and/or the viscous adhesive tape and the like), the adhesive, the viscous adhesive agent, the transparent resin, and the ultraviolet curing resin couples the light receiving surface of solar cell 100 and the surface of wiring substrate 200 on the side where solar cell 100 is placed. Instead of or together with this configuration, a configuration may be employed, in which the fixing member such as fixing tape 500 (the adhesive tape and/or the viscous adhesive tape and the like), the adhesive, the viscous adhesive agent, the transparent resin, and the ultraviolet curing resin couples the back surface (the surface opposite to the light receiving surface of solar cell 100) of solar cell 100 and the surface of wiring substrate 200 on the side where solar cell 100 is placed.

In this case, from the viewpoint of ensuring long-term reliability, the fluid fixing member that is used here such as the adhesive, the viscous adhesive agent, the transparent resin, and the ultraviolet curing resin is preferably a member that contracts appropriately and expresses contraction power between solar cell 100 and wiring substrate 200 at the time of curing. In addition, the fixing member such as the adhesive, the viscous adhesive agent, the transparent resin, and the ultraviolet curing resin is also preferably a thermosetting member that is cured at the time of sealing by heating the sealant that will be described below.

It is to be noted that, when the configuration is employed in which the fixing member couples the back surface of solar cell 100 and the surface of wiring substrate 200 on the side where solar cell 100 is placed, it is preferable to place the fixing member at a portion other than the wirings placed on the surface of wiring substrate 200 on the side where solar cell 100 is placed.

Figure 7:
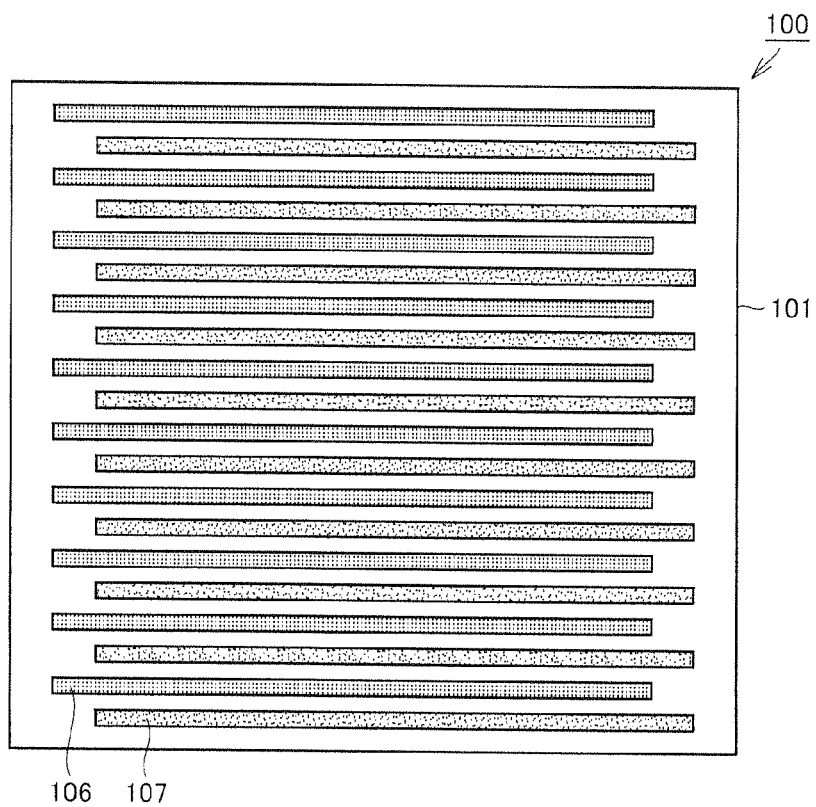
FIG. 7(a) is a schematic plan view of an exemplary back surface of the solar cell used in the present invention.
FIG. 7(b) is a schematic plan view of another exemplary back surface of the solar cell used in the present invention.
Figure 7:
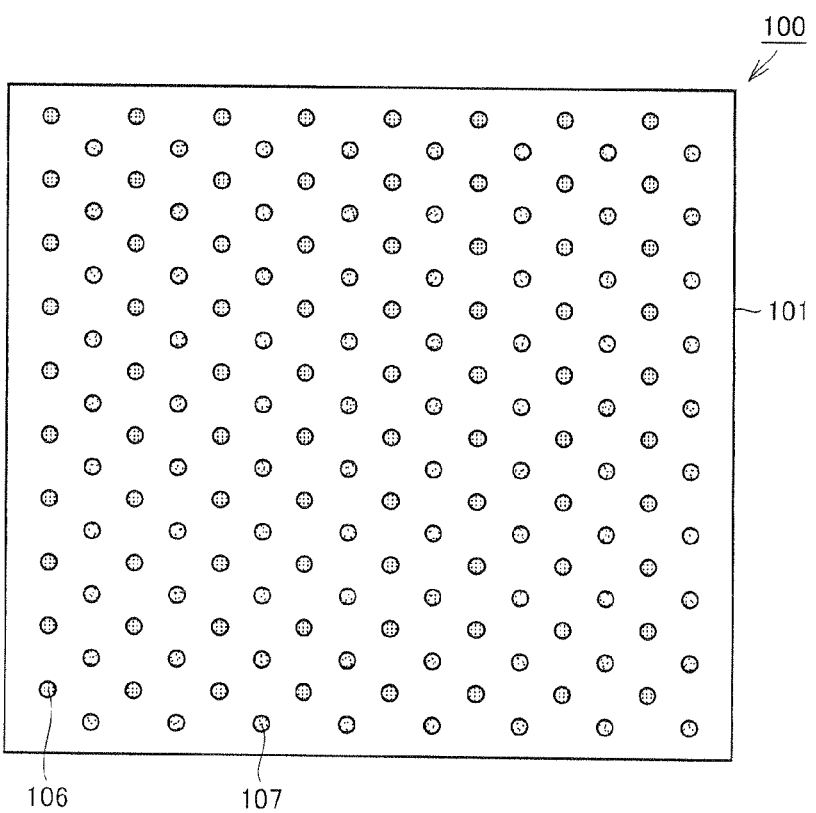

FIG. 7(a) shows a schematic plan view of an exemplary back surface of the solar cell used in the present invention. Here, solar cell 100 is a back surface electrode type solar cell in which both n electrode 106 and p electrode 107 are formed on the back surface of n type or p type silicon substrate 101. Each of n electrode 106 and p electrode 107 is formed in the shape of a strip that extends in the same direction (horizontal direction in the paper plane of FIG. 7(a)) on the back surface of silicon substrate 101. Strip-shaped n electrodes 106 and strip-shaped p electrodes 107 are alternately arranged one by one in the vertical direction in the paper plane of FIG. 7(a).

FIG. 7(b) shows a schematic plan view of another exemplary back surface of the solar cell used in the present invention. Again, solar cell 100 is a back surface electrode type solar cell in which both n electrode 106 and p electrode 107 are formed on the back surface of silicon substrate 101. Each of n electrode 106 and p electrode 107 is formed in the shape of a dot. Dot-shaped n electrodes 106 are arranged adjacent to each other and dot-shaped p electrodes 107 are arranged adjacent to each other in each of the vertical and horizontal directions in the paper plane of FIG. 7(b).

By forming each of n electrode 106 and p electrode 107 on the back surface of silicon substrate 101 of solar cell 100 used in the present invention in the shape of the strip as shown in FIG. 7(a) and/or in the shape of the dot as shown in FIG. 7(b), it is more likely to suppress occurrence of bubbles between solar cell 100 and wiring substrate 200 after sealing into the sealant that will be described below. Therefore, the formation of each electrode in such a shape is preferable.

Each of n electrode 106 and p electrode 107 can be formed, for example, by using a method such as a vacuum deposition method, a sputtering method, a screen printing method, an ink jet method, a spray method, or a plating method. Since wiring for the n type 109 and wiring for the p type 110 of wiring substrate 200 can bear most of the conductor resistance, the material usage amount for each of n electrode 106 and p electrode 107 can be considerably reduced. In addition, any material can be used as the material for n electrode 106 and p electrode 107 without particular limitation, as long as the material is a conductive material.

Figure 8:
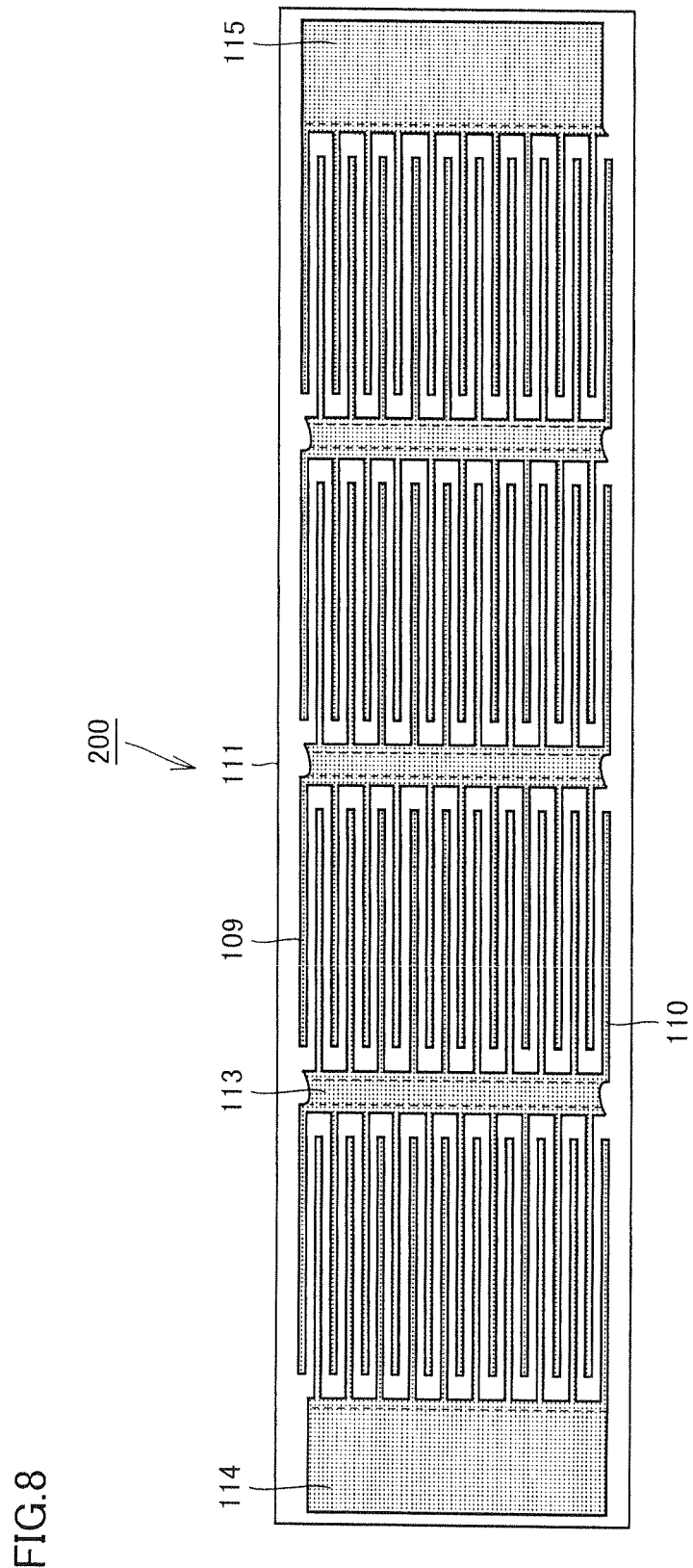
FIG. 8 is a schematic plan view of an exemplary wiring substrate used in the present invention.

FIG. 8 shows a schematic plan view of an exemplary wiring substrate used in the present invention. Here, wiring for the n type 109 and wiring for the p type 110 as well as a connecting electrode 113 for electrically connecting wiring for the n type 109 and wiring for the p type 110 are provided on the surface of insulating base material 111 of wiring substrate 200, as the wiring pattern.

Further, a bus bar p electrode 114 for power collection is electrically connected to wiring for the p type 110 placed at one end in the longitudinal direction of insulating base material 111. A bus bar n electrode 115 for power collection is electrically connected to wiring for the n type 109 placed at the other end thereof.

It is to be noted that, although respective regions for wiring for the n type 109, wiring for the p type 110, connecting electrode 113, bus bar p electrode 114, and bus bar n electrode 115 are separated by dashed lines in FIG. 8, the present invention is not limited to the separation shown in FIG. 8.

Further, as insulating base material 111 on which the wiring pattern of wiring substrate 200 is formed, for example, a base material made of a material having an electrical resistance higher than that of each of wiring for the n type 109 and wiring for the p type 110 (for example, polyimide having a resistance to heat of not less than 230° C.) can be used. It is preferable, however, to use inexpensive and transparent PEN (polyethylene naphthalate) and/or PET (polyethylene terephthalate). When a base material made of a transparent material such as PEN and PET is used as insulating base material 111 of wiring substrate 200, positional relationship between the electrodes of solar cell 100 and the wiring pattern of wiring substrate 200 can be readily confirmed, and when the placement of solar cell 100 on the wiring pattern is automated, accurate alignment can be performed for example by forming an alignment mark on the back surface of solar cell 100.

Further, as the material for wiring for the n type 109, wiring for the p type 110, connecting electrode 113, bus bar p electrode 114, and bus bar n electrode 115 that configure the wiring pattern formed on insulating base material 111 of wiring substrate 200, any material can be used without particular limitation as long as the material is a conductive material such as a metal and a transparent conductive film. From the viewpoint of reducing the electrical resistance of the wirings, wiring for the n type 109, wiring for the p type 110, connecting electrode 113, bus bar p electrode 114, and bus bar n electrode 115 are preferably made of a material including at least one type selected from the group consisting of copper, aluminum, and silver.

Figure 9:
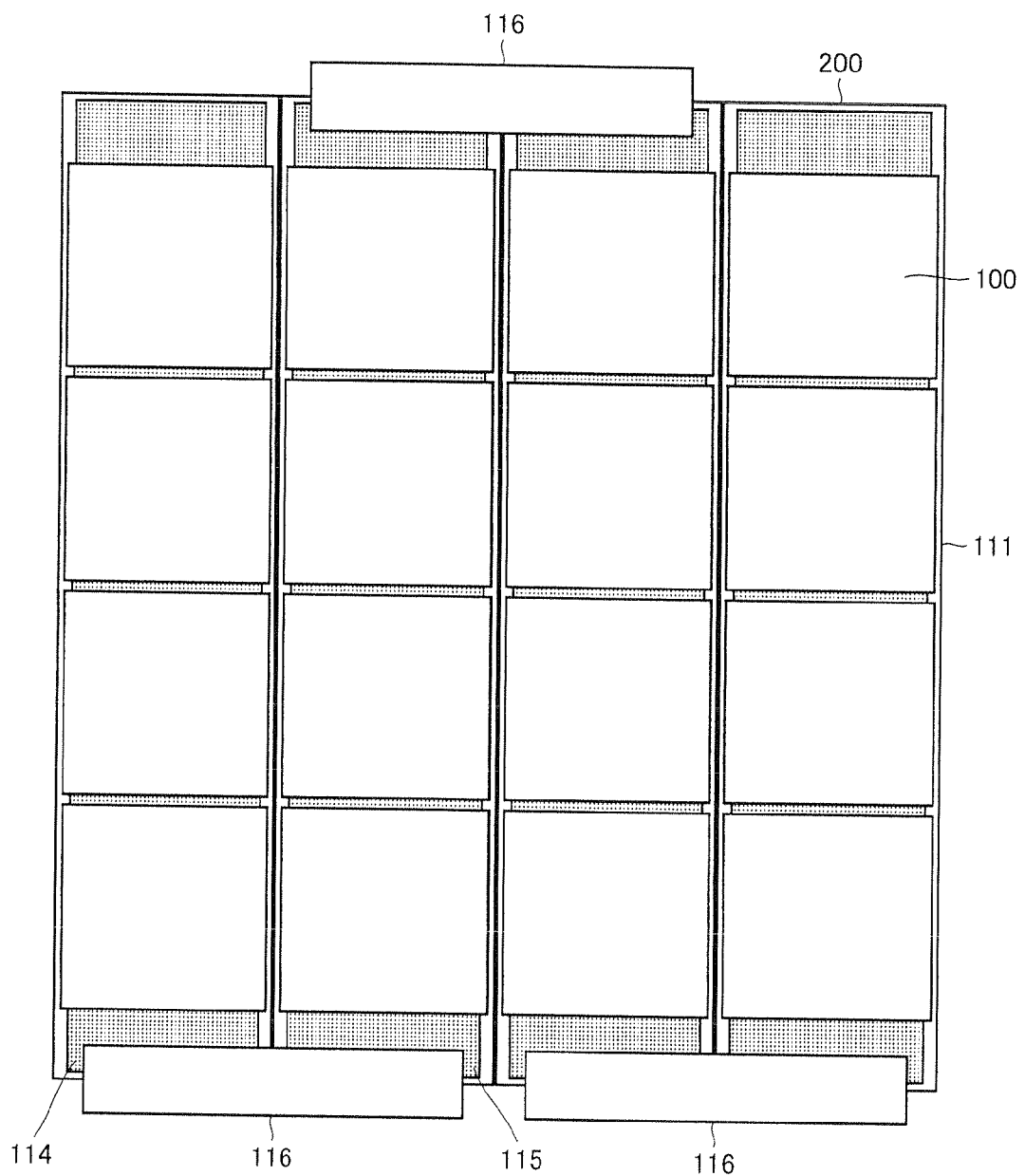
FIG. 9 is a schematic plan view of an example where a plurality of solar cells are placed on a wiring pattern of the wiring substrate shown in FIG. 8.

FIG. 9 shows a schematic plan view of an example where a plurality of solar cells 100 are placed on the wiring pattern of wiring substrate 200 shown in FIG. 8. Here, four wiring substrates 200 shown in FIG. 8 are arranged in parallel, and four solar cells 100 for each wiring substrate 200 are disposed in a straight line along the longitudinal direction of wiring substrate 200. Further, of two adjacent wiring substrates 200, bus bar p electrode 114 of one wiring substrate 200 and bus bar n electrode 115 of the other wiring substrate 200 are electrically connected by a conductive member 116. Thereby, 16 solar cells 100 are connected in series.

Figure 10:
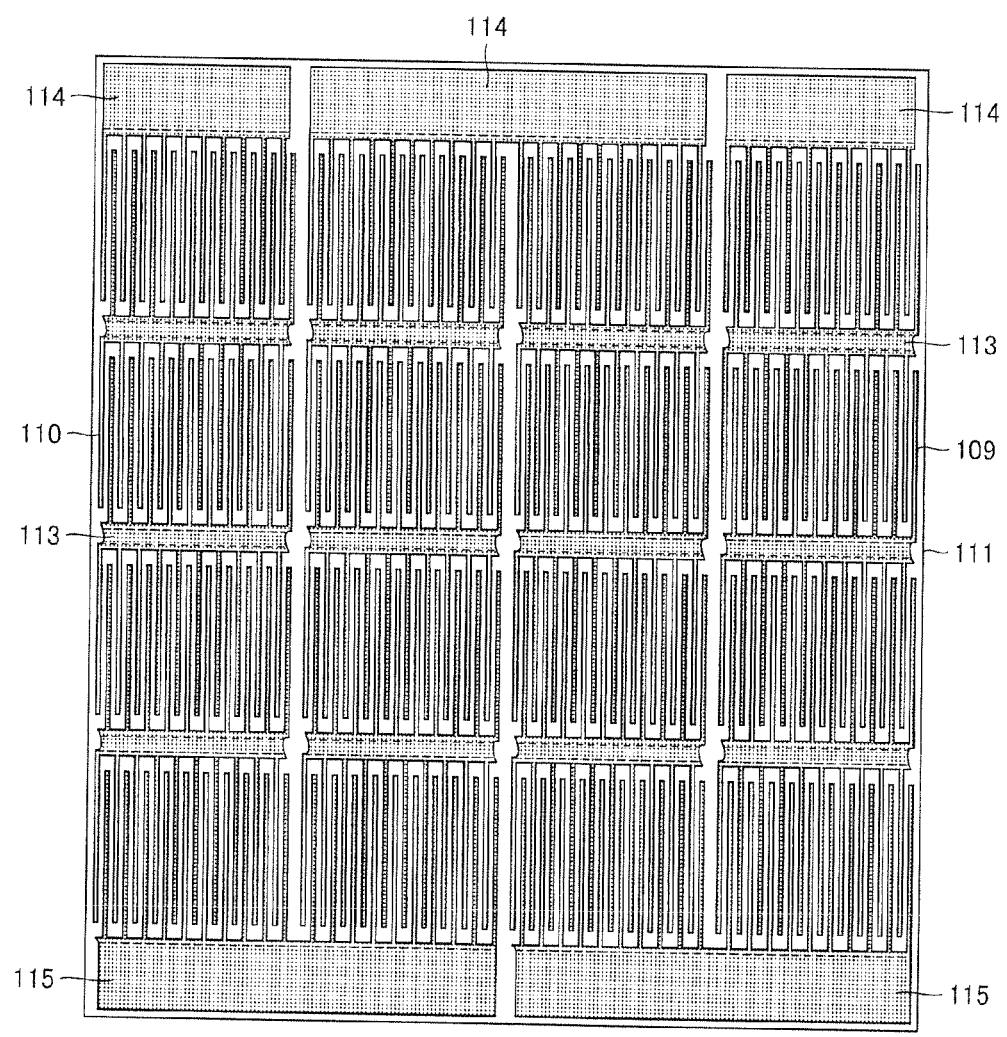
FIG. 10 is a schematic plan view of another exemplary wiring substrate used in the present invention.
Figure 11:
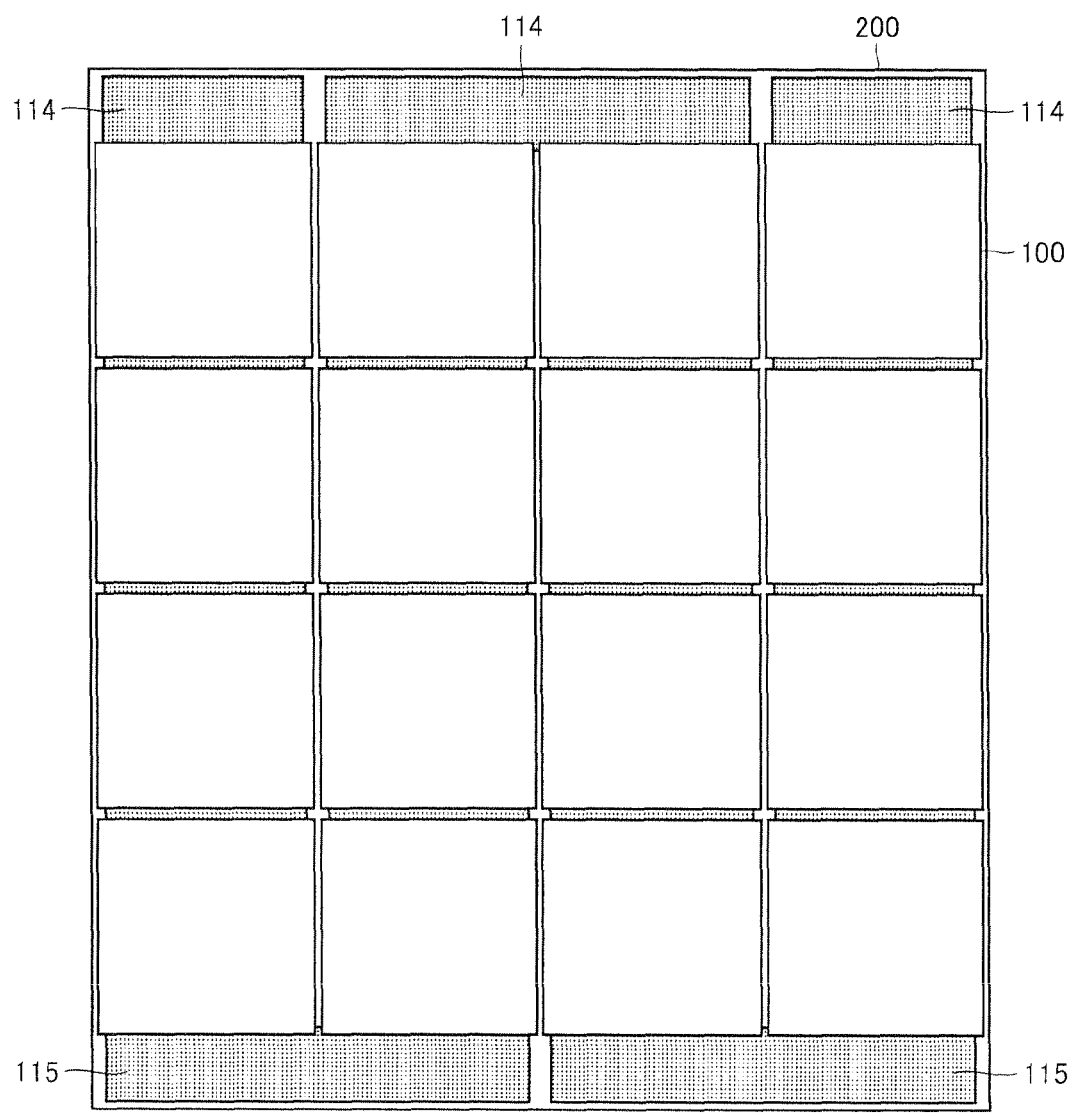
FIG. 11 is a schematic plan view of an example where a plurality of solar cells are placed on a wiring pattern of the wiring substrate shown in FIG. 10.

FIG. 10 shows a schematic plan view of another exemplary wiring substrate used in the present invention. Further, FIG. 11 shows a schematic plan view of an example where a plurality of solar cells 100 are placed on the wiring pattern of wiring substrate 200 shown in FIG. 10. This example is preferable in that, as shown in FIG. 11, 16 solar cells 100 are naturally electrically connected in series by placing solar cells 100 on wiring substrates 200 without using conductive member 116 to electrically connect wiring substrates 200.

Figure 12:
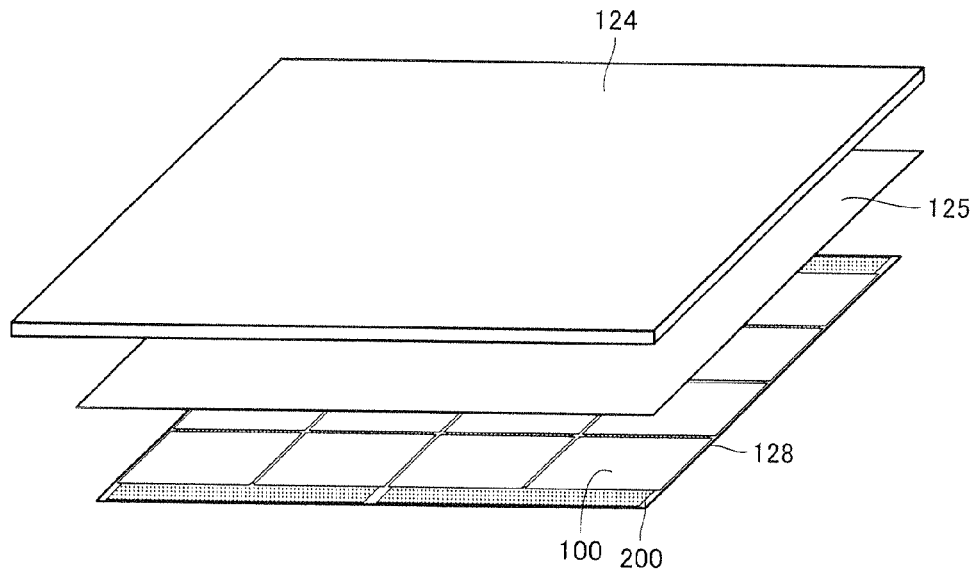
FIG. 12 is a schematic perspective view illustrating an exemplary method for sealing a wiring substrate disposed on a protective sheet and having a plurality of solar cells placed thereon, into a sealant.

Next, in step 5 (S5) of FIG. 1, after placing the plurality of solar cells 100 on the wiring pattern of wiring substrate 200, sealing into the sealant is performed (a second step). As shown for example in a schematic perspective view of FIG. 12, the sealing can be performed by sealing wiring substrate 200 disposed on a protective sheet 128 and having the plurality of solar cells 100 placed thereon, into a sealant 125. It is to be noted that a transparent substrate 124 may be further placed on a surface of sealant 125.

Figure 13:
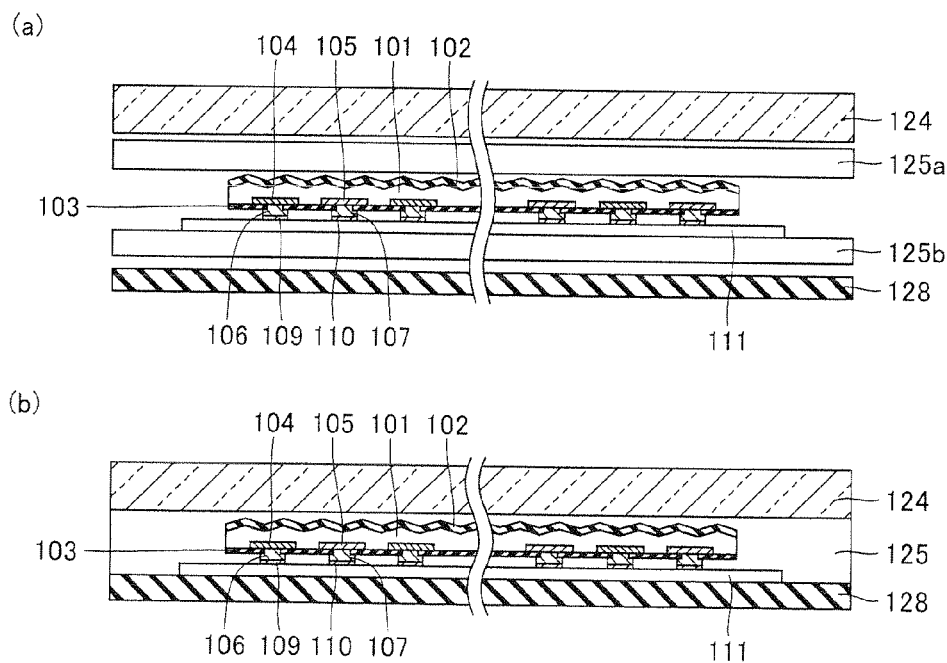
FIGS. 13(a) and (b) are schematic cross sectional views illustrating an exemplary method for placing solar cells on a wiring pattern of a wiring substrate, and thereafter sealing them into a sealant.

FIGS. 13(a) and (b) show schematic cross sectional views illustrating an exemplary method for placing the solar cells on the wiring pattern of the wiring substrate, and thereafter sealing them into the sealant. Firstly, as shown in FIG. 13(a), n electrode 106 of the solar cell is placed on wiring for the n type 109 formed on insulating substrate 111 serving as the base material for the wiring substrate to come into direct contact therewith, and p electrode 107 of the solar cell is placed on wiring for the p type 110 to come into direct contact therewith, and thus the solar cells are placed on the wiring substrate.

Next, a first transparent resin 125a provided with transparent substrate 124 is placed on the side of the solar cell opposite to the side where the wiring substrate is placed. A second transparent resin 125b provided with protective sheet 128 is placed on the side of the wiring substrate opposite to the side where the solar cell is placed. As a material for each of first transparent resin 125a and second transparent resin 125b, the same material as that of sealant 125 described above can be used.

Then, first transparent resin 125a and second transparent resin 125b are press-bonded and subjected to heat treatment. Thereby, first transparent resin 125a and second transparent resin 125b are cured in an integrated manner, and thus, sealant 125 is formed as shown in FIG. 13(b). As a result, the solar cells are strongly press-bonded to the wiring substrate, and the press-bonding between n electrode 106 of the solar cell and wiring for the n type 109 of the wiring substrate as well as the press-bonding between p electrode 107 of the solar cell and wiring for the p type 110 of the wiring substrate are each strengthened. Consequently, excellent electrical connection is established between these electrodes and wirings. The wiring substrate and the solar cells are sealed into this sealant 125 as shown in FIG. 13(b), and thus, the solar cell module of the present invention is fabricated.

Here, the press-bonding and heat treatment of first transparent resin 125a and second transparent resin 125b are performed, for example, by using a device called a laminator for performing vacuum press-bonding and heat treatment, or the like. As a result, first transparent resin 125a and second transparent resin 125b are thermally deformed. These transparent resins are integrated as a result of thermal curing and the like to form sealant 125, and the wiring substrate and the solar cells are wrapped in and sealed into sealant 125.

It is to be noted that vacuum press-bonding is a process of press-bonding under an atmosphere having a pressure lower than the atmospheric pressure. When vacuum press-bonding is used as a method for press-bonding first transparent resin 125a and second transparent resin 125b, a void is less likely to be formed between first transparent resin 125a and second transparent resin 125b. Further, as long as the inside of sealant 125 formed by integrating first transparent resin 125a and second transparent resin 125b is maintained under vacuum, press-bonding power caused by the outside atmospheric pressure is always applied continuously to between the solar cells and the wiring substrate to continue expressing fixing power between the solar cells and the wiring substrate. In addition, bubbles are less likely to be left in the inside of sealant 125. Therefore, the use of vacuum press-bonding is preferable. Further, the use of vacuum press-bonding is advantageous in terms of ensuring uniform press-bonding power between the solar cells and the wiring substrate.

Furthermore, if first transparent resin 125a and second transparent resin 125b are made of ethylene vinyl acetate resin, the above heat treatment can be performed, for example, by heating these transparent resins to a temperature that is higher than or equal to 100° C. and lower than or equal to 200° C.

Figure 14:
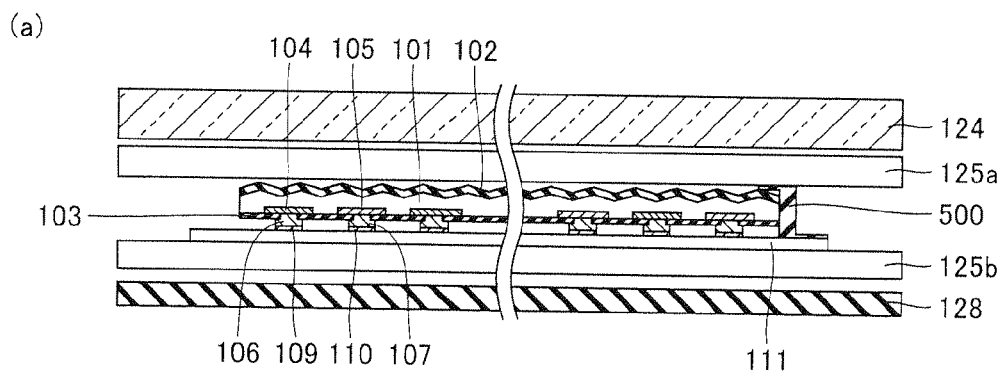
FIGS. 14(a) and (b) are schematic cross sectional views illustrating another exemplary method for placing solar cells on a wiring pattern of a wiring substrate, and thereafter sealing them into a sealant.
Figure 14:
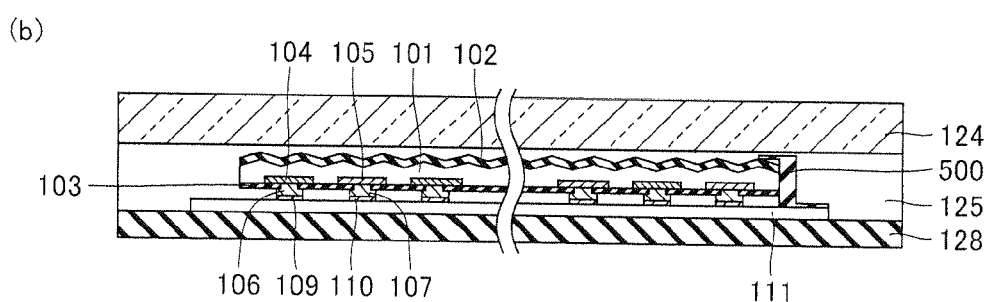

FIGS. 14(a) and (b) show schematic cross sectional views illustrating another exemplary method for placing the solar cells on the wiring pattern of the wiring substrate, and thereafter sealing them into the sealant. This method is similar to the method shown in FIGS. 13(a) and (b) except that the solar cell is fixed to the wiring substrate using fixing tape 500.

It is to be noted that fixing tape 500 is sealed into sealant 125 of the solar cell module with being left inside and may be seen from the light receiving surface side of the solar cell module in some cases. Accordingly, it is preferable to use a transparent tape as fixing tape 500, and it is more preferable to use a tape having an excellent degree of close contact with sealant 125, or a tape made of a material that is integrated with sealant 125 after press-bonding, is not subjected to degassing and the like during the manufacturing process, and is weather resistant so as not to be changed in quality during practical use.

Although the case where fixing tape 500 is used as the fixing member is again described as in the above, the adhesive and/or the viscous adhesive agent may be applied to the region from the light receiving surface of solar cell 100 to the surface of wiring substrate 200 on the side where solar cell 100 is placed, instead of or together with fixing tape 500. Alternatively, at least one of the transparent resin and the ultraviolet curing resin may be applied to the region from the light receiving surface of solar cell 100 to the surface of wiring substrate 200 on the side where solar cell 100 is placed, instead of or together with fixing tape 500.

It is to be noted that, as described above, when the fluid fixing member such as the adhesive, the viscous adhesive agent, the transparent resin, and the ultraviolet curing resin is used as the fixing member for fixing solar cell 100 and wiring substrate 200, the fluid fixing member can be readily placed by using the technique of dripping the fluid fixing member from the light receiving surface side of solar cell 100, and the like. Therefore, the use of the fluid fixing member is preferable.

In addition, the configuration has been described in the above, in which the fixing member such as fixing tape 500 (the adhesive tape and/or the viscous adhesive tape and the like), the adhesive, the viscous adhesive agent, the transparent resin, and the ultraviolet curing resin couples the light receiving surface of solar cell 100 and the surface of wiring substrate 200 on the side where solar cell 100 is placed. Instead of or together with this configuration, the present invention may have a configuration in which the fixing member such as fixing tape 500 (the adhesive tape and/or the viscous adhesive tape and the like), the adhesive, the viscous adhesive agent, the transparent resin, and the ultraviolet curing resin couples the back surface (the surface opposite to the light receiving surface of solar cell 100) of solar cell 100 and the surface of wiring substrate 200 on the side where solar cell 100 is placed.

In addition, as described above, when the configuration is employed in which the fixing member couples the back surface of solar cell 100 and the surface of wiring substrate 200 on the side where solar cell 100 is placed, it is preferable to place the fixing member at a portion other than the wirings placed on the surface of wiring substrate 200 on the side where solar cell 100 is placed.

Figure 15:
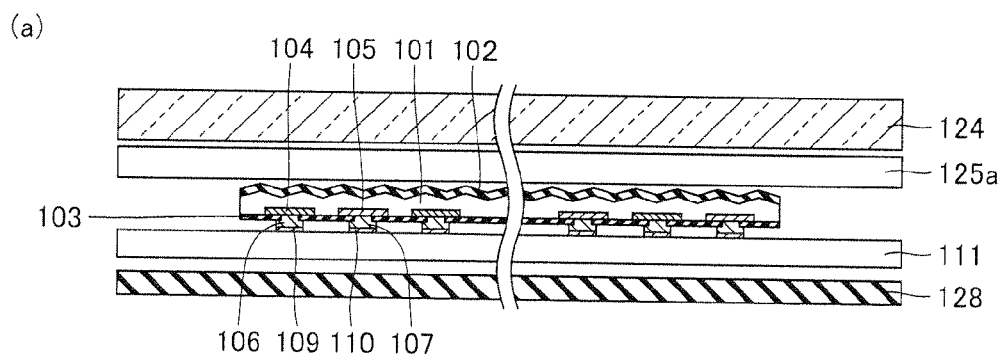
FIGS. 15(a) and (b) are schematic cross sectional views illustrating another exemplary method for placing solar cells on a wiring pattern of a wiring substrate, and thereafter sealing them into a sealant.
Figure 15:
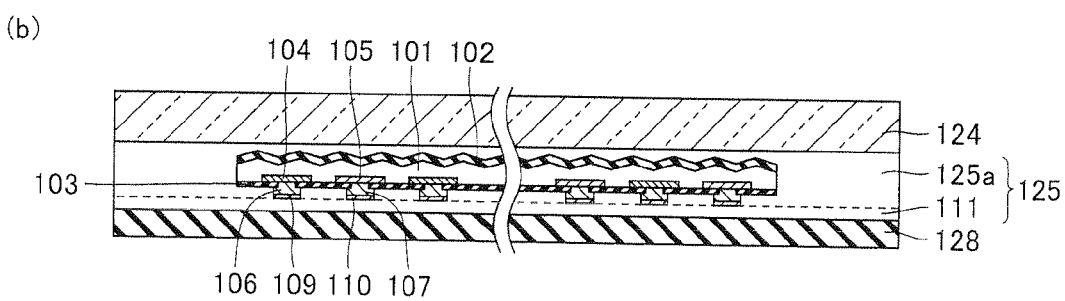

FIGS. 15(*a*) and (*b*) show schematic cross sectional views illustrating another exemplary method for placing the solar cells on the wiring pattern of the wiring substrate, and thereafter sealing them into the sealant. This method is characterized in that a transparent resin is used as a material for insulating substrate 111 serving as the base material for the wiring substrate, a portion of sealant 125 functions as insulating substrate 111 of the wiring substrate, and the wiring pattern is formed on insulating substrate 111.

In this method, firstly, as shown in FIG. 15(*a*), n electrode 106 of the solar cell is placed on wiring for the n type 109 and p electrode 107 of the solar cell is placed on wiring for the p type 110 formed on insulating substrate 111 made of the transparent resin and serving as the base material for the wiring substrate, and thus, the solar cells are placed on the wiring substrate. Next, first transparent resin 125*a* provided with transparent substrate 124 is placed on the side of the solar cell opposite to the side where the wiring substrate is placed.

Then, first transparent resin 125*a* and insulating substrate 111 are press-bonded, and thereafter subjected to heat treatment. Thereby, first transparent resin 125*a* and insulating substrate 111 are cured in an integrated manner, and first transparent resin 125*a* and insulating substrate 111 are integrated to form sealant 125 as shown in FIG. 15(*b*). As a result, a portion of sealant 125 (the portion of the sealant located below the wiring substrate (the portion of insulating substrate 111)) serves as the base material for the wiring substrate, and the wiring pattern is provided on the base material. Consequently, the solar cell module including the wiring substrate having the base material made of the transparent resin and the wiring pattern on the base material is fabricated.

Since the number of members used can be decreased in this method, operation efficiency in the process of manufacturing the solar cell module of the present invention can be enhanced, and material cost can be reduced.

Further, in this method, not only the press-bonding power generated between the solar cells and the wiring substrate as a result of formation of sealant 125, but also the press-bonding power as a result of thermal deformation of the transparent resin that configures insulating substrate 111 into a shape allowing the transparent resin to enter a space between n electrode 106 and p electrode 107 are applied. Therefore, it is more likely to further strengthen each of the press-bonding between n electrode 106 of the solar cell and wiring for the n type 109 of the wiring substrate as well as the press-bonding between p electrode 107 of the solar cell and wiring for the p type 110 of the wiring substrate, as compared with the above methods shown in FIGS. 13 and 14. Accordingly, this method is preferable in that, when the electrodes of the solar cells are brought into direct contact with the wirings of the wiring substrate, more excellent electrical connection is likely to be established between the electrodes of the solar cells and the wiring pattern of the wiring substrate, as compared with the above methods shown in FIGS. 13 and 14.

Furthermore, in this method, from the viewpoint of enhancing close contact power between first transparent resin 125*a* and insulating substrate 111 made of the transparent resin, it is preferable to use the same material for the transparent resin that configures insulating substrate 111 and the transparent resin that configures first transparent resin 125*a*.

As described above, in the present invention, if there is a member that supports the wiring pattern, the member can be used as the base material for the wiring substrate. The wiring substrate can also be configured by using a portion of sealant 125 as the base material for the wiring substrate and forming the wirings on the base material as described above.

Figure 16:
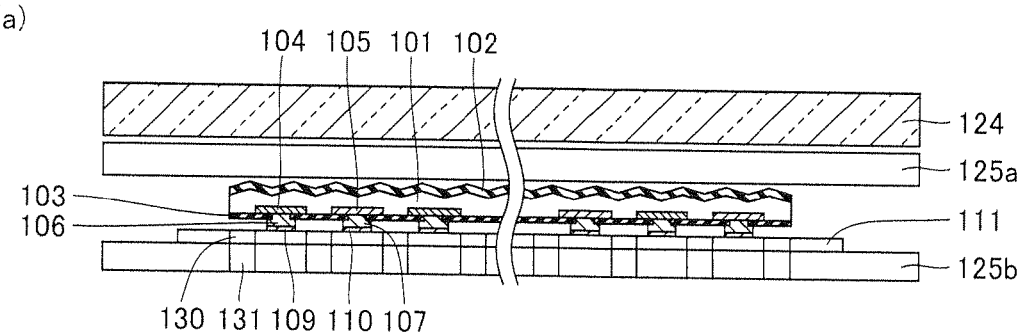
FIGS. 16(a) to (c) are schematic cross sectional views illustrating another exemplary method for placing solar cells on a wiring pattern of a wiring substrate, and thereafter sealing them into a sealant.
Figure 16:
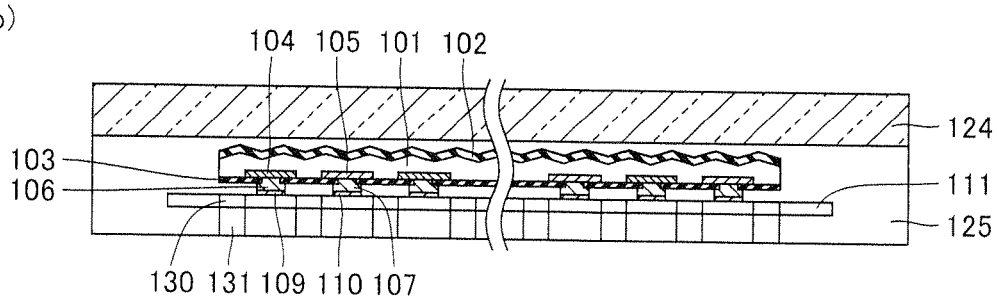
Figure 16:
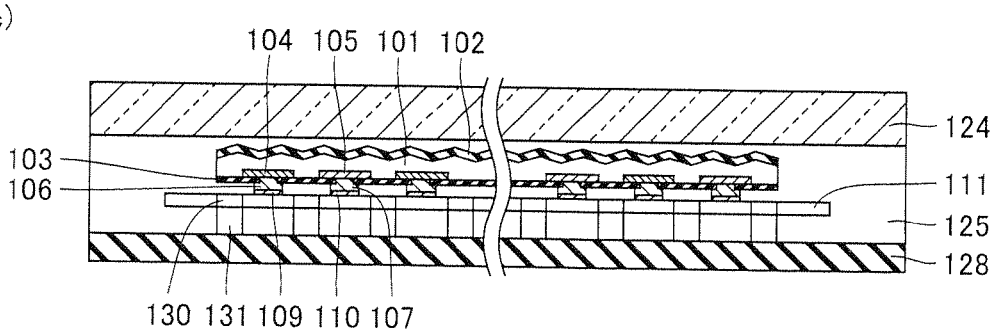

FIGS. 16(*a*) to (*c*) show schematic cross sectional views illustrating another exemplary method for placing the solar cells on the wiring pattern of the wiring substrate, and thereafter sealing them into the sealant. This method is characterized in that the wiring substrate has a through hole 130 penetrating from one surface to the other surface of insulating substrate 111, second transparent resin 125*b* placed on the side of the wiring substrate opposite to the side where the solar cell is placed has a through hole 131 penetrating from one surface to the other surface thereof, and the opening of through hole 130 at least partially overlaps the opening of through hole 131. This method is effective when a sealing step using a sealant is automated.

In this method, firstly, as shown in FIG. 16(*a*), second transparent resin 125*b* having through hole 131 is placed at a predetermined position of the laminator (not shown) having a vacuum suction function, and insulating substrate 111 of the wiring substrate having through hole 130 is placed on second transparent resin 125*b*. On this occasion, the opening of through hole 130 in insulating substrate 111 of the wiring substrate is caused to at least partially overlap the opening of through hole 131 in second transparent resin 125*b*.

Next, the solar cell is arranged on the wiring substrate in accordance with the alignment mark by using the transport unit described above and the like, and as a result of vacuum suction through a hole formed by coupling through hole 130 and through hole 131, the solar cell is fixed with high accuracy such that n electrode 106 of the solar cell is placed on wiring for the n type 109 of the wiring substrate and p electrode 107 of the solar cell is placed on wiring for the p type 110 of the wiring substrate.

Here, it is preferable to form the alignment mark on at least one of the wiring substrate and the solar cell, and it is more preferable to form the alignment mark on one surface or both surfaces of the solar cell. When insulating substrate 111 of the wiring substrate and second transparent resin 125*b* have a certain level of light permeability, positioning with higher accuracy can be performed by recognizing the alignment mark from the back surface of the solar cell through insulating substrate 111 and second transparent resin 125*b*, considering a dimensional error of silicon substrate 101 and various errors such as errors in the positional accuracy of the electrodes of the solar cell and the like.

It is to be noted that the alignment mark can be recognized, for example, by using a method of visually recognizing the alignment mark from above, a method of recognizing the alignment mark with a camera and the like, a method of recognizing the alignment mark with a light recognition sensor placed at a device such as the laminator, and the like.

In addition, the shape of the alignment mark is not particularly limited, and can be freely selected from the shapes including, for example, a cross shape, a round shape, a rhombus shape, and the like.

Next, as shown in FIG. 16(*b*), first transparent resin 125*a* and second transparent resin 125*b* are press-bonded, for example, by vacuum press-bonding and the like to form sealant 125, and the wiring substrate and the solar cells placed thereon are wrapped in and sealed into sealant 125. Thereafter, as shown in FIG. 16(c), protective sheet 128 is placed on the back surface of sealant 125, and thus, the solar cell module is fabricated.

By sealing solar cells 100 placed on the wiring pattern of wiring substrate 200 with sealant 125 using the method as described above, the solar cell module is completed. In the solar cell module, a terminal box can be attached to the back surface of sealant 125, and an aluminum frame can also be fitted to the outer periphery of the sealant.

Figure 17:
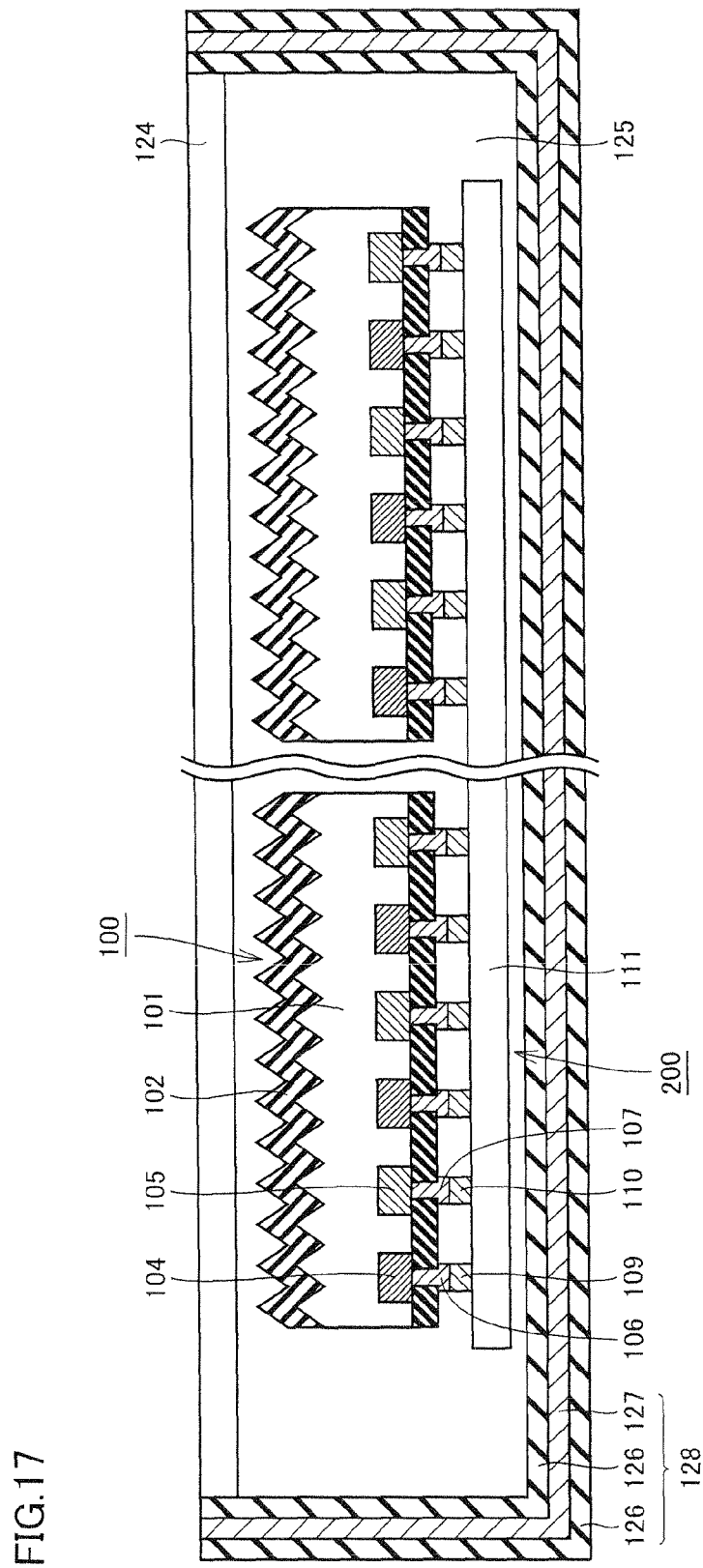
FIG. 17 is a schematic cross sectional view of an exemplary solar cell module manufactured using the present invention.
Figure 18:
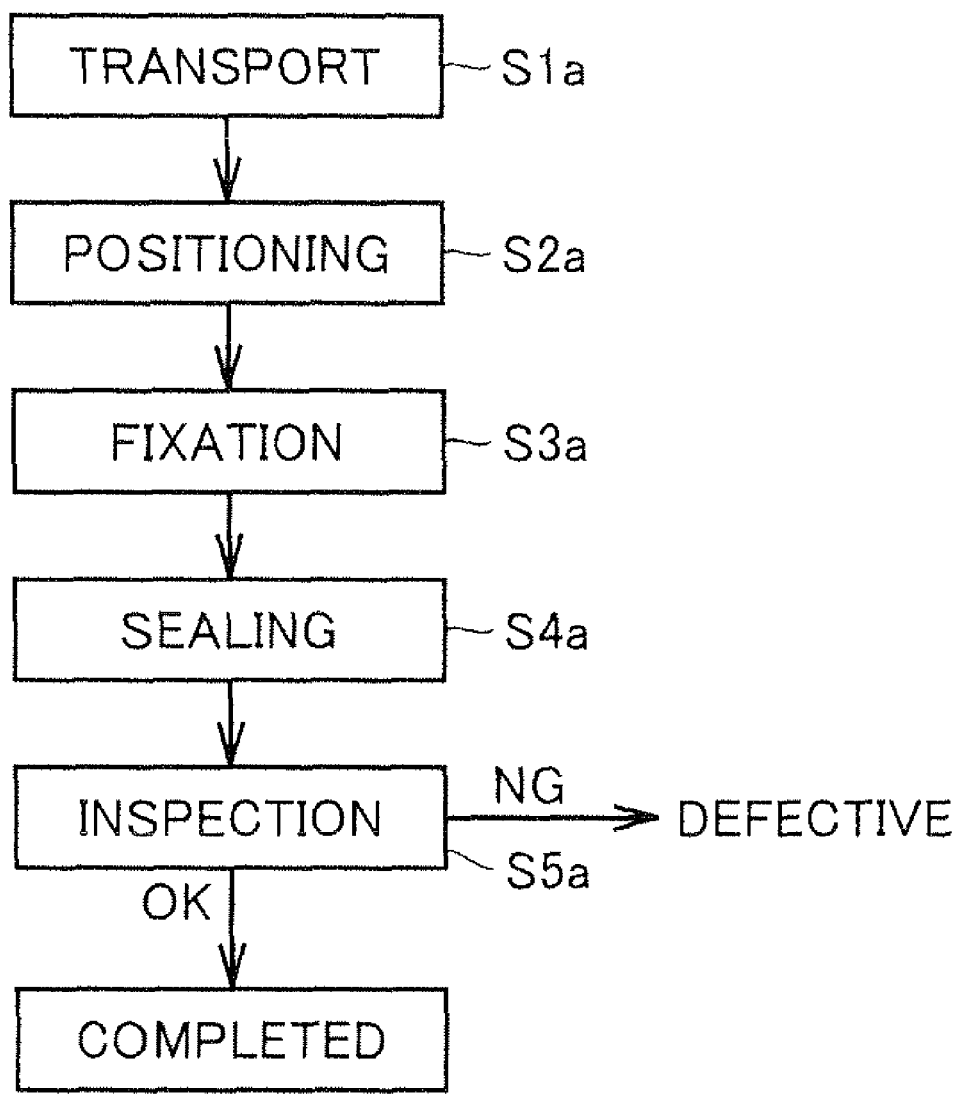
FIG. 18 is a flowchart of a manufacturing process for manufacturing a solar cell module described in Patent Document 1.

FIG. 17 shows a schematic cross-sectional view of an exemplary solar cell module manufactured using the present invention. Here, solar cells 100 placed on wiring substrate 200 are sealed into sealant 125 housed in protective sheet 128 that is formed by sandwiching a metal film 127 between two opposing insulating films 126. Transparent substrate 124 is placed on a surface of sealant 125.

As transparent substrate 124, for example, a substrate that is transparent to sunlight can be used without particular limitation, and a glass substrate or the like can be used, for example.

In addition, as sealant 125, for example, a resin that is transparent to sunlight and the like can be used without particular limitation. In particular, it is preferable to use, as sealant 125, at least one type of transparent resin selected from the group consisting of an ethylene vinyl acetate resin, an epoxy resin, an acrylic resin, a urethane resin, an olefin-based resin, a polyester resin, a silicone resin, a polystyrene resin, a polycarbonate resin, and a rubber-based resin. These transparent resins with excellent weather resistance have a high light permeability, and thus, can be secured with adequate strength to transparent substrate 124 formed of the glass substrate or the like, without significantly deteriorating the output (in particular, the short-circuit current or the operating current) of the solar cell module. Therefore, these transparent resins can seal solar cells 100 while ensuring long-term reliability of solar cells 100.

Further, as protective sheet 128, for example, a conventionally used protective sheet such as a weather-resistant film can also be used without particular limitation. However, it is preferable to use protective sheet 128 configured by sandwiching metal film 127 between insulating films 126 as shown in FIG. 17.

Furthermore, as insulating film 126, for example, a conventionally known insulating film can be used, and a PET film or the like can be used, for example.

In addition, as metal film 127, for example, a conventionally known metal film can be used. From the viewpoint of sufficiently suppressing permeation of water vapor and oxygen into sealant 125 and ensuring long-term reliability, however, it is preferable to use a metal film such as aluminum. Further, at a portion where it is difficult to bring protective sheet 128 into close contact, such as at an end face of the solar cell module, a moisture/oxygen permeation prevention tape that can suppress permeation of moisture and oxygen, such as a butyl rubber tape, can be used to bring protective sheet 128 into close contact completely.

In addition, since insulating substrate 111 of the wiring substrate and second transparent resin 125b on the wiring substrate side have through holes 130 and 131, respectively, a portion of thermally-deformed sealant 125 reaches an interface between solar cell 100 and wiring substrate 200. As described above, the hole formed by coupling through hole 130 and through hole 131 can be utilized as an adhering portion, and the hole can also be expected to have a secondary effect that it can also contribute to enhancement of the adhesion strength of both solar cell 100 and wiring substrate 200. Through holes 130 and 131 may have any shape, respectively, and can be, for example, a dot-shaped or strip-shaped hole. It is desirable that through holes 130 and 131 have a size and a width allowing inflow of an appropriate amount of sealant 125, such that uniform and excellent contact between the electrodes of solar cells 100 and the wirings of wiring substrate 200 is maintained.

As described above, in the present invention, since the inspection is conducted on solar cell 100 placed on wiring substrate 200 before it is sealed with sealant 125, sealing with sealant 125 can be performed after removing solar cell 100 determined by the inspection as not satisfying predetermined criteria beforehand.

Therefore, the method for manufacturing a solar cell module of the present invention can improve a manufacturing yield of the solar cell module configured by electrically connecting the plurality of solar cells 100 by placing them on wiring substrate 200, and sealing them with the sealant, and can enhance reliability and characteristics of the solar cell module manufactured.

Further, in the present invention, the electrodes of solar cells 100 can also be brought into direct contact with the wirings of wiring substrate 200 by mechanical and physical press-bonding power resulting from the fixing power of sealant 125 and the atmospheric pressure. Even in this case, it has already been confirmed that adequate electrical characteristics that are equal to or better than those obtained when connection is established via a conductive material such as solder and a conductive paste can be obtained, and sufficiently excellent reliability can also be ensured.

Further, when solar cell 100 is placed such that the electrodes of solar cell 100 come into direct contact with the wirings of wiring substrate 200 in the present invention, the step of wiring by using reflow and the like, the step of applying the adhesive to solar cell 100 and wiring substrate 200, and the number of members used can be reduced, respectively. Therefore, the solar cell module can be manufactured easily, as compared with conventional methods.

Furthermore, when solar cell 100 is placed such that the electrodes of solar cell 100 come into direct contact with the wirings of wiring substrate 200 in the present invention, the step of melting the solder or the conductive paste and the step of drying the adhesive are not essential. Therefore, the solar cell module can be manufactured at a low temperature, and in addition, occurrence of warping and misalignment of solar cell 100 due to thermal expansion, thermal contraction and the like of solar cell 100 can be suppressed. Accordingly, when solar cell 100 is placed such that the electrodes of solar cell 100 come into direct contact with the wirings of wiring substrate 200 in the present invention, not only manufacturing of the solar cell module at a low temperature but also reduction in the thickness and increase in the size of solar cell 100 can be achieved, and thus, significant cost reduction can be accomplished.

It is to be noted that, in the present invention, solar cell 100 is preferably a back surface electrode type solar cell formed by placing both of the n electrode and the p electrode on one surface of solar cell 100, in particular only on the back surface thereof. The back surface electrode type solar cell includes a so-called back contact cell and an MWT (Metal Wrap Through) cell. In the present invention, however, solar cell 100 is not limited to a back surface electrode type solar cell, and the present invention is also applicable to a double surface electrode type solar cell having electrodes on each of the light receiving surface and the back surface by using a transparent plastic film for insulating substrate, 111 of wiring substrate 200.

In addition, when a back surface electrode type solar cell is used as solar cell 100, the n electrode and the p electrode are formed adjacent to each other at a predetermined spacing on the back surface of the semiconductor substrate such as silicon substrate 101. The spacing between the n electrode and the p electrode may be set, for example, to hundreds of micrometers to several millimeters. In some cases, in order to obtain more excellent characteristics, the spacing between the n electrode and the p electrode may be set to several micrometers to several tens of micrometers, or may be set to obtain a very minute pattern. In such a case, when the electrodes of the back surface electrode type solar cell and the wirings of the wiring substrate are connected via the conductive material such as the solder and the conductive paste, the conductive material may form a bridge between the n electrode and the p electrode of the back surface electrode type solar cell in the step of applying the conductive material to the electrodes of solar cell 100 and the wirings of wiring substrate 200 or in the step of welding, which may cause a short circuit. However, when solar cell 100 is placed such that the electrodes of solar cell 100 come into direct contact with the wirings of wiring substrate 200 in the present invention, these risks can be avoided, and thus such placement is preferable.

In addition, when solar cell 100 is placed such that the electrodes of solar cell 100 come into direct contact with the wirings of wiring substrate 200 in the present invention, the presence of projections and the like formed by the solder, the conductive paste, the adhesive and the like can be lessened, and thus cracking in solar cell 100 during the step of assembling the solar cell module can be reduced.

It should be understood that the embodiments and the examples disclosed herein are illustrative and not limitative in any respect. The scope of the present invention is defined by the terms of the claims, rather than the above description, and is intended to include any modifications within the scope and meaning equivalent to the terms of the claims.

INDUSTRIAL APPLICABILITY

According to the present invention, a method for manufacturing a solar cell module configured by electrically connecting a plurality of solar cells by placing them on a wiring substrate, and sealing them with a sealant, that can improve a manufacturing yield of the solar cell module can be provided.

The invention claimed is:

1. A method for manufacturing a solar cell module in which a wiring substrate having a base material and a wiring formed on said base material, and a plurality of solar cells electrically connected by being placed on the wiring of said wiring substrate are sealed with a sealant, comprising:
    a first step of placing at least one of said solar cells on said wiring of said wiring substrate;
    a second step of fixing said solar cell to said wiring substrate using a fixing member; and
    a third step of sealing said wiring substrate and said solar cells with said sealant,
    the method including the step of inspecting electrical connection between said solar cells and said wiring after said first step and before said second step.

2. The method for manufacturing a solar cell module according to claim 1, wherein said step of inspecting is conducted by bringing a probe into contact with said wiring of said wiring substrate to which said solar cell is electrically connected.

3. The method for manufacturing a solar cell module according to claim 1, comprising the step of removing said solar cell determined in said step of inspecting as not satisfying predetermined electrical connection inspection criteria, from on said wiring of said wiring substrate, and, instead of said solar cell, placing another solar cell on said wiring.

4. The method for manufacturing a solar cell module according to claim 1, wherein said step of inspecting is conducted by pressing said solar cell to said wiring substrate and bringing an electrode of said solar cell into direct contact with said wiring.

5. The method for manufacturing a solar cell module according to claim 1, wherein said fixing member is at least one type selected from the group consisting of an adhesive tape, a viscous adhesive tape, an adhesive, and a viscous adhesive agent.

6. The method for manufacturing a solar cell module according to claim 1, wherein said fixing member is made of at least one of a transparent resin and an ultraviolet curing resin.

7. The method for manufacturing a solar cell module according to claim 1, wherein said fixing member couples a light receiving surface of said solar cell and a surface of said wiring substrate on a side where said solar cell is placed.

8. The method for manufacturing a solar cell module according to claim 1, wherein a through hole penetrating from one surface to the other surface of said base material is formed in said wiring substrate.

9. The method for manufacturing a solar cell module according to claim 1, wherein said base material for said wiring substrate is made of a transparent resin.

10. The method for manufacturing a solar cell module according to claim 1, wherein said sealant includes at least one type of transparent resin selected from the group consisting of an ethylene vinyl acetate resin, an epoxy resin, an acrylic resin, a urethane resin, an olefin-based resin, a polyester resin, a silicone resin, a polystyrene resin, a polycarbonate resin, and a rubber-based resin.

11. The method for manufacturing a solar cell module according to claim 1, wherein said solar cell is a back surface electrode type solar cell.

* * * * *